United States Patent
Sasagawa et al.

(10) Patent No.: US 9,287,405 B2
(45) Date of Patent: Mar. 15, 2016

(54) SEMICONDUCTOR DEVICE COMPRISING OXIDE SEMICONDUCTOR

(71) Applicant: Semiconductor Energy Laboratory Co., Ltd., Atsugi-shi, Kanagawa-ken (JP)

(72) Inventors: Shinya Sasagawa, Chigasaki (JP); Motomu Kurata, Isehara (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 13/632,603

(22) Filed: Oct. 1, 2012

(65) Prior Publication Data

US 2013/0092924 A1 Apr. 18, 2013

(30) Foreign Application Priority Data

Oct. 13, 2011 (JP) ................. 2011-226080

(51) Int. Cl.
*H01L 29/786* (2006.01)
*H01L 29/66* (2006.01)
*H01L 27/115* (2006.01)

(52) U.S. Cl.
CPC ...... *H01L 29/78606* (2013.01); *H01L 27/1156* (2013.01); *H01L 29/66969* (2013.01); *H01L 29/7869* (2013.01)

(58) Field of Classification Search
CPC .................................................. H01L 29/7869
USPC ............. 257/43, E29.094, E29.098, E29.112, 257/E29.117, E29.137, E29.151, E31.003, 257/E31.015, E31.018, E31.022, E31.027, 257/E31.041; 438/85, 104
See application file for complete search history.

(56) References Cited

U.S. PATENT DOCUMENTS 4,468,855 A * 9/1984 Sasaki ................. H01L 21/2636
148/DIG. 106
5,200,846 A * 4/1993 Hiroki .................. G02F 1/1362
257/E21.413

(Continued)

FOREIGN PATENT DOCUMENTS

EP 1737044 A 12/2006
EP 2226847 A 9/2010

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Fernando L Toledo
*Assistant Examiner* — Christine L Hagan
(74) *Attorney, Agent, or Firm* — Eric J. Robinson; Robinson Intellectual Property Law Office, P.C.

(57) ABSTRACT

A miniaturized transistor having excellent electrical characteristics is provided with high yield. Further, a semiconductor device including the transistor and having high performance and high reliability is manufactured with high productivity. In a semiconductor device including a transistor in which an oxide semiconductor film including a channel formation region and low-resistance regions between which the channel formation region is sandwiched, a gate insulating film, and a gate electrode layer whose top surface and side surface are covered with an insulating film including an aluminum oxide film are stacked, a source electrode layer and a drain electrode layer are in contact with part of the oxide semiconductor film and the top surface and a side surface of the insulating film including an aluminum oxide film.

6 Claims, 12 Drawing Sheets

(56) References Cited

U.S. PATENT DOCUMENTS

| | | | |
|---|---|---|---|
| 5,289,030 A * | 2/1994 | Yamazaki et al. | 257/410 |
| 5,572,047 A * | 11/1996 | Hiroki | G02F 1/13624 257/350 |
| 5,576,556 A * | 11/1996 | Takemura | H01L 27/1214 257/344 |
| 5,592,008 A * | 1/1997 | Yamazaki | H01L 27/1214 257/347 |
| 5,614,731 A * | 3/1997 | Uchikoga | H01L 29/41733 257/350 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,303,946 B1 * | 10/2001 | Sung | H01L 29/41733 257/59 |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,288,768 B2 * | 10/2012 | Kim | H01L 29/7869 257/43 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0266150 A1 * | 12/2004 | Sera | 438/530 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 * | 11/2006 | Sugihara et al. | 257/646 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 * | 2/2007 | Shin et al. | 313/504 |
| 2007/0046191 A1 | 3/2007 | Saito | |
| 2007/0052025 A1 * | 3/2007 | Yabuta | H01L 29/7869 257/347 |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0224878 A1 | 9/2010 | Kimura | |
| 2011/0089414 A1 | 4/2011 | Yamazaki et al. | |
| 2011/0101351 A1 * | 5/2011 | Yamazaki | 257/57 |
| 2011/0114936 A1 * | 5/2011 | Akimoto et al. | 257/40 |
| 2011/0114943 A1 | 5/2011 | Yamazaki et al. | |
| 2011/0147738 A1 | 6/2011 | Yamazaki et al. | |
| 2011/0240998 A1 * | 10/2011 | Morosawa et al. | 257/57 |
| 2012/0001167 A1 * | 1/2012 | Morosawa | H01L 29/78618 257/43 |
| 2012/0032164 A1 * | 2/2012 | Ohnuki | 257/43 |

FOREIGN PATENT DOCUMENTS

| | | |
|---|---|---|
| JP | 60-19886.1 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2011-181801 A | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

(56) References Cited

OTHER PUBLICATIONS

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m=7,8,9, and 16) in the In2O3—ZnGa2O4—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N. et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.
Li.C et al., "Modulated Structures of Homologous Compounds InMO3(ZnO)m (M=In,Ga; m=Integer) Described by Four Dimensional Superspace Group,", Journal of Solid State Chemistry, 1998, 1998, vol. 139, pp. 347-355.
Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDS,", SID Digest '09 ; SID International Symposium Digest of Technical Papers, May 31, 2009, vol. 40, pp. 899-902.
Kanno.H et al., "White Stacked Electrophosphorecent Organic Light-Emitting Devices Employing MoO3 as a charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition: The "Blue Phase", ", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane,", SID Digest '09 : SID International Sympoium Digest of Technical Papers, May 31, 2009, pp. 280-283.
Lee.M et al., "15.4:Excellent Performance of Indium—Oxide-Based Thin-Film Transistors by DC Sputtering,", SID Digest '09: SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by Peald Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Paper, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 ; SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "SUFTLA Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,",

(56) References Cited

OTHER PUBLICATIONS

SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium of Technical Papers, 2007, vol. 38, pp. 1737-1740.

Nakamura.M, "Synthesis of Homologous Compound with New Long-Period Structure,", NIRIM Newsletter, mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B; Mg, Mn, Fe, Ni, Cu, Or, Zn]at Temperatures over 1000° C., ", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Reiew. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers May 20, 2008, vol. 39, pp. 629-632.

Orita.M et al., "Mechanism of Electrical Conductivity of Transparent InGaZnO4,", Phys. Rev, B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 6, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B '(Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE COMPRISING OXIDE SEMICONDUCTOR

BACKGROUND OF THE INVENTION

1. Field of the Invention

The present invention relates to a semiconductor device and a method for manufacturing the semiconductor device.

In this specification, a semiconductor device generally means any device which can function by utilizing semiconductor characteristics, and an electro-optic device, a semiconductor circuit, and an electronic appliance are all included in the category of the semiconductor device.

2. Description of the Related Art

Attention has been focused on a technique for forming a transistor using a semiconductor thin film (also referred to as a thin film transistor (TFT)) formed over a substrate having an insulating surface. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor including a semiconductor layer formed using an amorphous oxide containing indium (In), gallium (Ga), and zinc (Zn) (In—Ga—Zn—O-based amorphous oxide) is disclosed (see Patent Document 1).

REFERENCE

Patent Document

[Patent Document 1] Japanese Published Patent Application No. 2011-181801

SUMMARY OF THE INVENTION

To achieve high-speed operation, low power consumption, high integration, or the like of a transistor, it is necessary to miniaturize a transistor.

An object of one embodiment of the present invention is to provide a structure of a semiconductor device which achieves quick response and high-speed drive by improving on-state characteristics (e.g., on-state current and field-effect mobility) of a miniaturized transistor, and to provide a method for manufacturing the structure, in order to achieve a semiconductor device with higher performance.

The yield of transistors in the manufacturing process might decline due to miniaturization thereof.

An object of one embodiment of the present invention is to provide a miniaturized transistor having excellent electrical characteristics and high reliability with high yield.

An object of one embodiment of the present invention is to manufacture a semiconductor device having high performance and high reliability with high productivity.

In a semiconductor device including a transistor in which an oxide semiconductor film, a gate insulating film, and a gate electrode layer whose top surface and side surface are covered with an insulating film including an aluminum oxide film are stacked, a source electrode layer and a drain electrode layer are in contact with part of the oxide semiconductor film and the top surface and a side surface of the insulating film including an aluminum oxide film. The oxide semiconductor film includes a channel formation region and preferably includes low-resistance regions between which the channel formation region is sandwiched.

Since the top surface and the side surface of the gate electrode layer are covered with the insulating film including an aluminum oxide film, electrical failure such as a short circuit between the gate electrode layer and the source electrode layer or the drain electrode layer can be prevented owing to the insulating film including an aluminum oxide film even when the source electrode layer and the drain electrode layer overlap with the top surface of the gate electrode layer. Accordingly, a transistor having a miniaturized structure can be manufactured with high yield.

In the semiconductor device, the oxide semiconductor film is a film containing much (excessive) oxygen, into which oxygen is introduced in the manufacturing process. When the top surface and the side surface of the gate electrode layer are covered with the insulating film including an aluminum oxide film, the channel formation region and part of the low-resistance regions in the oxide semiconductor film, which overlap with the gate electrode layer, can be covered with the insulating film including an aluminum oxide film.

The insulating film including an aluminum oxide film has a superior shielding effect (blocking effect), which is not permeable to either oxygen or impurities such as hydrogen or moisture.

Thus, during the manufacturing process and after the manufacture, the insulating film including an aluminum oxide film functions as a protective film for preventing entry of impurities such as hydrogen and moisture, which can cause a change, into the oxide semiconductor film and release of oxygen, which is a main component material of the oxide semiconductor, from the oxide semiconductor film. Accordingly, the transistor can have stable electrical characteristics.

Oxygen (which includes at least one of an oxygen radical, an oxygen atom, and an oxygen ion) may be introduced to the oxide semiconductor film to supply the oxygen to the oxide semiconductor film. Oxygen can be introduced by an ion implantation method, an ion doping method, a plasma immersion ion implantation method, plasma treatment, or the like.

Low-resistance regions whose resistances are lower than that of the channel formation region and which include a dopant are formed in the oxide semiconductor film so that the channel formation region is sandwiched between the low-resistance regions, by introducing the dopant into the oxide semiconductor film in a self-aligning manner with the use of the gate electrode layer as a mask. The dopant is an impurity by which the conductivity of the oxide semiconductor film is changed. As the method for introducing the dopant, an ion implantation method, an ion doping method, a plasma immersion ion implantation method, or the like can be used.

With the oxide semiconductor film including the low-resistance regions between which the channel formation region is sandwiched in the channel length direction, on-state characteristics (e.g., on-state current and field-effect mobility) of the transistor are increased, which enables high-speed operation and high-speed response of the transistor.

One embodiment of the invention disclosed in this specification is a semiconductor device including, over an oxide insulating film, an oxide semiconductor film including a channel formation region and low-resistance regions between which the channel formation region is sandwiched, a gate insulating film over the oxide semiconductor film, a gate electrode layer over the gate insulating film overlapping with the channel formation region, an insulating film including an aluminum oxide film covering a top surface and a side surface of the gate electrode layer, and a wiring layer in contact with the low-resistance region and part of a top surface and a side surface of the insulating film including the aluminum oxide film. Each of the low-resistance regions includes a dopant.

One embodiment of the invention disclosed in this specification is a semiconductor device including, over an oxide insulating film, an oxide semiconductor film including a channel formation region and low-resistance regions between which the channel formation region is sandwiched; a gate insulating film over the oxide semiconductor film; a gate electrode layer over the gate insulating film overlapping with the channel formation region; an insulating film including an aluminum oxide film covering a top surface and a side surface of the gate electrode layer; an interlayer insulating layer in which an opening reaching the low-resistance region is provided, over the oxide semiconductor film, the gate insulating film, the gate electrode layer, and the insulating film including the aluminum oxide film; and a wiring layer in contact with the low-resistance region and part of a top surface and a side surface of the insulating film including the aluminum oxide film, which are provided in the opening. Each of the low-resistance regions includes a dopant.

In the oxide semiconductor film, an oxygen concentration in a region overlapping with the gate electrode layer and the insulating film including an oxide aluminum film may be higher than that in a region which overlaps with neither the gate electrode layer nor the insulating film including an oxide aluminum film.

One embodiment of the invention disclosed in this specification is a method for manufacturing a semiconductor device, including the steps of forming an oxide insulating film; forming an oxide semiconductor film over the oxide insulating film; forming a gate insulating film over the oxide semiconductor film; forming a gate electrode layer overlapping with the oxide semiconductor film, over the gate insulating film; introducing a dopant selectively into the oxide semiconductor film using the gate electrode layer as a mask to form a low-resistance region; forming an insulating film including an aluminum oxide film to cover a top surface and a side surface of the gate electrode layer; and forming a wiring layer in contact with the low-resistance region and part of a top surface and a side surface of the insulating film including the aluminum oxide film.

One embodiment of the invention disclosed in this specification is a method for manufacturing a semiconductor device, including the steps of forming an oxide insulating film; forming an oxide semiconductor film over the oxide insulating film; forming a gate insulating film over the oxide semiconductor film; forming a gate electrode layer overlapping with the oxide semiconductor film, over the gate insulating film; introducing a dopant selectively into the oxide semiconductor film using the gate electrode layer as a mask to form a low-resistance region; forming an insulating film including an aluminum oxide film to cover a top surface and a side surface of the gate electrode layer; forming an interlayer insulating layer over the oxide semiconductor film, the gate insulating film, the gate electrode layer, and the insulating film including the aluminum oxide film; forming an opening in the interlayer insulating layer to expose part of the low-resistance region and part of a top surface and a side surface of the insulating film including the aluminum oxide film; and forming a wiring layer in contact with the low-resistance region and part of the top surface and the side surface of the insulating film including the aluminum oxide film in the opening.

In the above structure, the gate insulating film may be etched using the gate electrode layer as a mask and the insulating film including the aluminum oxide film may be in contact with the oxide semiconductor film. Alternatively, the gate insulating film may be provided between the insulating film including the aluminum oxide film and the oxide semiconductor film.

In the above structure, an electrode layer overlapping with the wiring layer (source electrode layer or drain electrode layer) may be provided below the oxide semiconductor film and in contact with the low-resistance region. The electrode layer may be provided over the oxide insulating film or embedded in the oxide insulating film.

When the electrode layer is provided below the oxide semiconductor film so as to overlap with a region (contact region) where the oxide semiconductor film is in contact with the wiring layer (source electrode layer or drain electrode layer), the contact resistance between the oxide semiconductor film and the wiring layer functioning as the source electrode layer or the drain electrode layer can be reduced. Accordingly, on-state characteristics of the transistor can be improved.

In the above structure, a surface of the oxide insulating film over which the oxide semiconductor film is formed may be planarized by planarization treatment. As a result, the thin oxide semiconductor film can be provided with good coverage. As the planarization treatment, a chemical mechanical polishing method, an etching method, plasma treatment, or the like, or a combination thereof can be used.

Further, heat treatment (dehydration or dehydrogenation treatment) by which hydrogen or moisture is eliminated from the oxide semiconductor film may be performed on the oxide semiconductor film. In the case where a crystalline oxide semiconductor film is used as the oxide semiconductor film, heat treatment for crystallization may be performed.

One embodiment of the present invention relates to a semiconductor device including a transistor or a semiconductor device including a circuit which is formed by using a transistor. For example, one embodiment of the present invention relates to a semiconductor device including a transistor in which a channel formation region is formed using an oxide semiconductor or a semiconductor device including a circuit which is formed by using such a transistor. For example, one embodiment of the present invention relates to an electronic device which includes, as a component, a semiconductor integrated circuit including an LSI, a CPU, a power device mounted in a power circuit, a memory, a thyristor, a converter, an image sensor, or the like, or a light-emitting display device including a light-emitting element or an electro-optical device typified by a liquid crystal display panel.

A miniaturized transistor having excellent electrical characteristics and high reliability can be provided with high yield.

A semiconductor device including the transistor and having high performance and high reliability can be manufactured with high productivity.

DETAILED DESCRIPTION OF THE INVENTION

Hereinafter, embodiments of the invention disclosed in this specification will be described with reference to the accompanying drawings. Note that the invention disclosed in this specification is not limited to the following description, and it is easily understood by those skilled in the art that modes and details can be variously changed without departing from the spirit and the scope of the invention. Thus, the invention disclosed in this specification is not construed as being limited to the description of the following embodiments. Note that the ordinal numbers such as "first" and "second" in this specification are used for convenience and do not denote the order of steps and the stacking order of layers. In addition, the ordinal numbers in this specification do not denote particular names which specify the present invention.

Embodiment 1

In this embodiment, one embodiment of a semiconductor device and a method for manufacturing the semiconductor device will be described with reference to FIGS. 1A and 1B. In this embodiment, a transistor including an oxide semiconductor film is described as an example of the semiconductor device.

The transistor may have a single-gate structure in which one channel formation region is formed, a double-gate structure in which two channel formation regions are formed, or a triple-gate structure in which three channel formation regions are formed. Alternatively, the transistor may have a dual-gate structure including two gate electrode layers positioned over and under a channel formation region with a gate insulating film provided therebetween.

Figure 1A:
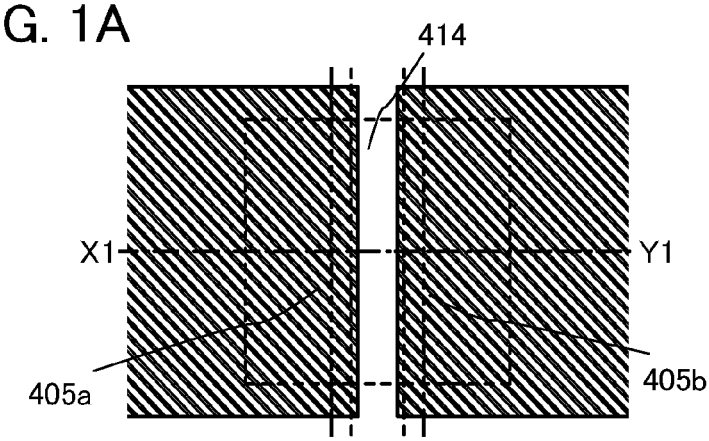
FIGS. 1A and 1B are a plan view and a cross-sectional view illustrating one embodiment of a semiconductor device.
Figure 1B:
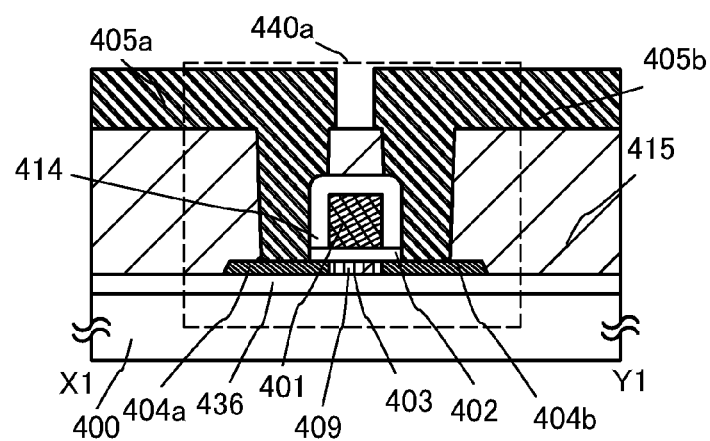

A transistor 440a illustrated in FIGS. 1A and 1B is an example of a top-gate transistor. FIG. 1A is a plan view and FIG. 1B is a cross-sectional view taken along dashed line X1-Y1 in FIG. 1A. Note that in FIG. 1A, an interlayer insulating film 415 is not illustrated.

As illustrated in FIG. 1B, which is a cross-sectional view in the channel length direction, a semiconductor device including the transistor 440a includes, over a substrate 400 having an insulating surface over which an oxide insulating film 436 is provided, an oxide semiconductor film 403 including a channel formation region 409 and low-resistance regions 404a and 404b, a gate insulating film 402, a gate electrode layer 401, an insulating film 414 including an aluminum oxide film which covers the top surface and a side surface of the gate electrode layer 401, the interlayer insulating film 415, a source electrode layer 405a, and a drain electrode layer 405b.

The interlayer insulating film 415 planarizes unevenness of the transistor 440a and includes openings exposing the low-resistance regions 404a and 404b, the insulating film 414 including an aluminum oxide film, and the gate insulating film 402. In the openings, the source electrode layer 405a and the drain electrode layer 405b are provided in contact with the low-resistance regions 404a and 404b in the oxide semiconductor film 403, the gate insulating film 402, and part of the top surface and a side surface of the insulating film 414 including an aluminum oxide film.

In this embodiment, an aluminum oxide film is used as the insulating film 414 including an aluminum oxide film. With the aluminum oxide film having a high density (film density higher than or equal to 3.2 g/cm$^3$, preferably higher than or equal to 3.6 g/cm$^3$), the transistor 440a can have stable electrical characteristics. The film density can be measured by Rutherford backscattering spectrometry (RBS) or X-ray reflection (XRR). The aluminum oxide film preferably contains a large amount of oxygen which exceeds at least the amount of oxygen in the stoichiometric composition in the film (bulk). For example, in the case of using the aluminum oxide film, the composition may be AlOx (x>1.5).

Since the top surface and the side surface of the gate electrode layer 401 are covered with the insulating film 414 including an aluminum oxide film, electrical failure such as a short circuit between the gate electrode layer 401 and the source electrode layer 405a or the drain electrode layer 405b can be prevented owing to the insulating film 414 including an aluminum oxide film even when the source electrode layer 405a and the drain electrode layer 405b overlap with the top surface of the gate electrode layer 401. Accordingly, the transistor 440a having a miniaturized structure can be manufactured with high yield.

The insulating film including an aluminum oxide film may be provided over the gate insulating film as in the transistor 440a or may be in contact with the oxide semiconductor film, as long as the insulating film including an aluminum oxide film covers the top surface and the side surface of the gate electrode layer. For example, as in a transistor 410a illustrated in FIG. 3A, the gate insulating film 402 may be etched using the gate electrode layer 401 as a mask and the insulating film 414 including an aluminum oxide film may be provided so as to cover the top surface and a side surface of a stack of the gate electrode layer 401 and the gate insulating film 402. In the transistor 410a, the oxide semiconductor film 403 is in contact with the insulating film 414 including an aluminum oxide film.

Figure 3A:
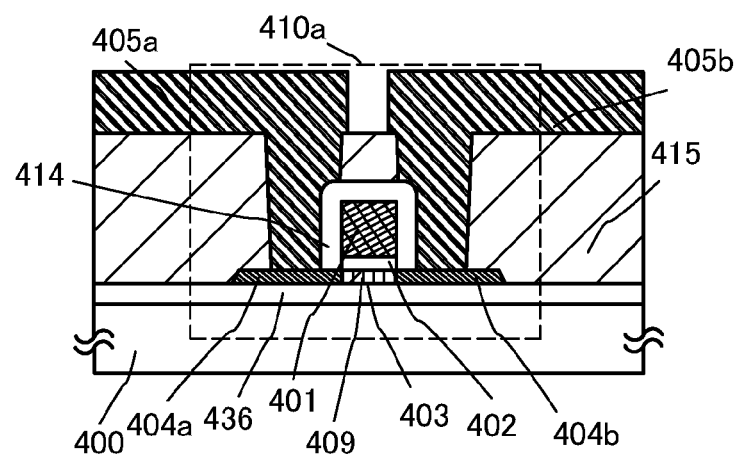
FIGS. 3A and 3B are cross-sectional views each illustrating one embodiment of a semiconductor device.
Figure 3B:
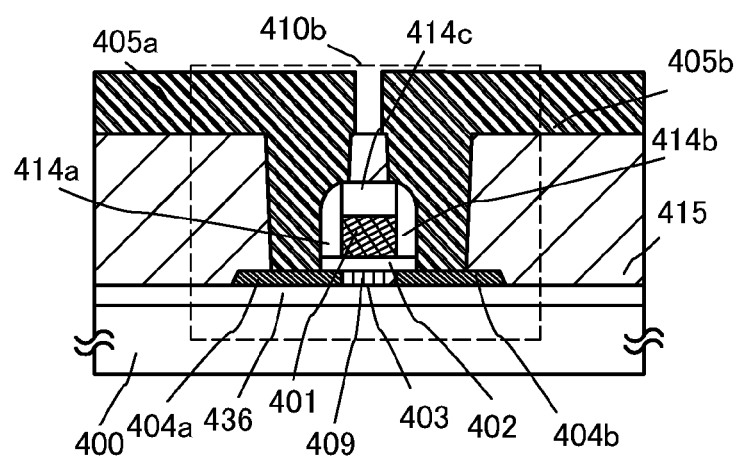

The insulating film including an aluminum oxide film which covers the top surface and the side surface of the gate electrode layer may be formed using a single continuous film as illustrated in FIG. 3A. Alternatively, the insulating film including an aluminum oxide film may be formed using a plurality of films. For example, as in a transistor 410b illustrated in FIG. 3B, a plurality of films, that is, an insulating film 414a including an aluminum oxide film and an insulating film 414b including an aluminum oxide film each of which covers the side surface of the gate electrode layer 401 and an insulating film 414c including an aluminum oxide film which covers the top surface of the gate electrode layer 401, may be provided.

In the manufacturing process of the semiconductor device, oxygen (which includes at least one of an oxygen radical, an oxygen atom, and an oxygen ion) may be introduced to the oxide semiconductor film 403 to supply the oxygen to the oxide semiconductor film. Oxygen can be introduced by an ion implantation method, an ion doping method, a plasma immersion ion implantation method, plasma treatment, or the like.

It is preferable that the oxide semiconductor film 403 in the transistor 440a include a region where the oxygen content is higher than that in the stoichiometric composition of the oxide semiconductor in a crystalline state. In that case, the oxygen content is preferably larger than that in the stoichiometric ratio of the oxide semiconductor. Alternatively, the oxygen content is higher than that of the oxide semiconductor in a single crystal state. In some cases, oxygen may exist between lattices of the oxide semiconductor.

When the top surface and the side surface of the gate electrode layer 401 are covered with the insulating film 414 including an aluminum oxide film, the channel formation region 409 and part of the low-resistance regions 404a and 404b in the oxide semiconductor film 403, which overlap with the gate electrode layer 401, can be covered with the insulating film 414 including an aluminum oxide film.

The insulating film 414 including an aluminum oxide film has a superior shielding effect (blocking effect), which is not permeable to either oxygen or impurities such as hydrogen or moisture.

Thus, during the manufacturing process and after the manufacture, the insulating film including an aluminum oxide film functions as a protective film for preventing entry of impurities such as hydrogen and moisture, which can cause a change, into the oxide semiconductor film and release of oxygen, which is a main component material of the oxide semiconductor, from the oxide semiconductor film. Accordingly, the transistor 440a can have stable electrical characteristics.

The low-resistance regions 404a and 404b whose resistances are lower than that of the channel formation region 409 and which include a dopant are formed in the oxide semiconductor film 403 so that the channel formation region 409 is sandwiched between the low-resistance regions 404a and 404b, by introducing the dopant into the oxide semiconductor film 403 in a self-aligning manner with the use of the gate electrode layer 401 as a mask. The dopant is an impurity by which the conductivity of the oxide semiconductor film 403 is changed. As the method for introducing the dopant, an ion implantation method, an ion doping method, a plasma immersion ion implantation method, or the like can be used.

With the oxide semiconductor film 403 including the low-resistance regions 404a and 404b between which the channel formation region 409 is provided in the channel length direction, on-state characteristics (e.g., on-state current and field-effect mobility) of the transistor 440a are increased, which enables high-speed operation and high-speed response of the transistor.

An oxide semiconductor used for the oxide semiconductor film 403 preferably contains at least indium (In) or zinc (Zn). In particular, In and Zn are preferably contained. The oxide semiconductor preferably contains, in addition to In and Zn, gallium (Ga) as a stabilizer that reduces variations in electrical characteristics among transistors using the above-described oxide. Tin (Sn) is preferably contained as a stabilizer. Hafnium (Hf) is preferably contained as a stabilizer. Aluminum (Al) is preferably contained as a stabilizer. Zirconium (Zr) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main components and there is no limitation on the ratio of In:Ga:Zn. Further, a metal element in addition to In, Ga, and Zn may be contained.

Alternatively, a material represented by $InMO_3(ZnO)_m$ (m>0, where m is not an integer) may be used as the oxide semiconductor. Note that M represents one or more metal elements selected from Ga, Fe, Mn, and Co. Further alternatively, a material represented by $In_2SnO_5(ZnO)_n$ (n>0, where n is an integer) may be used as the oxide semiconductor.

For example, an In—Ga—Zn-based oxide with an atomic ratio of In:Ga:Zn=1:1:1 (=1/3:1/3:1/3), In:Ga:Zn=2:2:1 (=2/5:2/5:1/5), or In:Ga:Zn=3:1:2 (=1/2:1/6:1/3), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

However, the composition is not limited to those described above, and a material having an appropriate composition may be used in accordance with necessary semiconductor characteristics (such as mobility, threshold voltage, and variation). To obtain necessary semiconductor characteristics, it is preferable that the carrier concentration, the impurity concentration, the defect density, the atomic ratio of a metal element to oxygen, the interatomic distance, the density, and the like be set as appropriate.

For example, high mobility can be obtained relatively easily in the case of using an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio of In:Ga:Zn=a:b:c (a+b+c=1) is in the neighborhood of the composition of an oxide including In, Ga, and Zn at the atomic ratio of In:Ga:Zn=A:B:C (A+B+C=1)" means that a, b, and c satisfy the following relation: $(a-A)^2+(b-B)^2+(c-C)^2 \leq r^2$, and r may be 0.05, for example. The same applies to other oxides.

The oxide semiconductor film 403 is in a single crystal state, a polycrystalline (also referred to as polycrystal) state, an amorphous state, or the like.

The oxide semiconductor film is preferably a c-axis aligned crystalline oxide semiconductor (CAAC-OS) film.

The CAAC-OS film is not completely single crystal nor completely amorphous. The CAAC-OS film is an oxide semiconductor film with a crystal-amorphous mixed phase structure where crystal parts are included in an amorphous phase. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With use of the CAAC-OS film in a transistor, change in electrical characteristics of the transistor due to irradiation with visible light or ultraviolet light can be reduced. Thus, the transistor has high reliability.

Note that part of oxygen included in the oxide semiconductor film may be substituted with nitrogen.

In an oxide semiconductor having a crystal part such as the CAAC-OS, defects in the bulk can be further reduced and when the surface flatness of the oxide semiconductor is improved, mobility higher than that of an oxide semiconductor in an amorphous state can be obtained. To improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, further preferably less than or equal to 0.1 nm.

Note that $R_a$ is obtained by expanding arithmetic mean surface roughness, which is defined by JIS B 0601: 2001 (ISO4287: 1997), into three dimensions so as to be applied to a curved surface. $R_a$ can be expressed as an "average value of the absolute values of deviations from a reference surface to a specific surface" and is defined by the following formula.

$$Ra = \frac{1}{S_0}\int_{y_1}^{y_2}\int_{x_1}^{x_2}|f(x,y)-Z_0|dxdy \quad \text{[FORMULA 1]}$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the x-y plane, and $Z_0$ represents the height of the reference surface (the average height of the specific surface). $R_a$ can be measured using an atomic force microscope (AFM).

The oxide semiconductor film 403 can be formed to have a thickness greater than or equal to 1 nm and less than or equal to 30 nm (preferably greater than or equal to 5 nm and less than or equal to 10 nm) by a sputtering method, a molecular beam epitaxy (MBE) method, a CVD method, a pulsed laser deposition method, an atomic layer deposition (ALD) method, or the like as appropriate. The oxide semiconductor film 403 may be formed with a sputtering apparatus which performs deposition on surfaces of a plurality of substrates set substantially perpendicular to a surface of a sputtering target.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For the deposition of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is lower than or equal to −80° C., preferably lower than or equal to −100° C. is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 200° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas is increased and the power is optimized in order to reduce plasma damage at the deposition. The proportion of oxygen in the deposition gas is 30 vol % or higher, preferably 100 vol %.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 2:2:1, 8:4:3, 3:1:1, 1:1:1, 4:2:3, or 3:1:2. The kinds of powder and the molar ratio for mixing powder may be determined as appropriate depending on the desired sputtering target.

FIGS. 2A to 2D illustrate an example of a method for manufacturing the semiconductor device including the transistor 440a.

First, the oxide insulating film 436 is formed over the substrate 400 having an insulating surface.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like; a ceramic substrate; a quartz substrate; or a sapphire substrate can be used. A single crystal semiconductor substrate or a polycrystalline semiconductor substrate of silicon, silicon carbide, or the like; a compound semiconductor substrate of silicon germanium or the like; an SOI substrate; or the like can be used as the substrate 400. Alternatively, the substrate provided with a semiconductor element can be used as the substrate 400.

The semiconductor device may be manufactured using a flexible substrate as the substrate 400. To manufacture a flexible semiconductor device, the transistor 440a including the oxide semiconductor film 403 may be directly formed over a flexible substrate; or alternatively, the transistor 440a including the oxide semiconductor film 403 may be formed over a manufacturing substrate, and then may be separated and transferred to a flexible substrate. Note that in order to separate the transistor 440a from the manufacturing substrate and transfer it to the flexible substrate, a separation layer may be provided between the manufacturing substrate and the transistor 440a including the oxide semiconductor film.

The oxide insulating film 436 can be formed using silicon oxide, silicon oxynitride, aluminum oxide, aluminum oxynitride, hafnium oxide, gallium oxide, or a mixed material of any of these materials by a plasma CVD method, a sputtering method, or the like.

The oxide insulating film 436 may be either a single layer or a stacked layer. For example, a silicon oxide film, an In—Hf—Zn-based oxide film, and the oxide semiconductor film 403 may be stacked in that order over the substrate 400; a silicon oxide film, an In—Zr—Zn-based oxide film with an atomic ratio of In:Zr:Zn=1:1:1, and the oxide semiconductor film 403 may be stacked in that order over the substrate 400; or a silicon oxide film, an In—Gd—Zn-based oxide film with an atomic ratio of In:Gd:Zn=1:1:1, and the oxide semiconductor film 403 may be stacked in that order over the substrate 400.

In this embodiment, a silicon oxide film is formed by a sputtering method as the oxide insulating film 436.

Further, a nitride insulating film may be provided between the oxide insulating film 436 and the substrate 400. The nitride insulating film can be formed using silicon nitride, silicon nitride oxide, aluminum nitride, aluminum nitride oxide, or a mixed material of any of these materials by a plasma CVD method, a sputtering method, or the like.

Next, the oxide semiconductor film 403 is formed over the oxide insulating film 436.

The oxide insulating film 436, which is in contact with the oxide semiconductor film 403, preferably contains a large amount of oxygen which exceeds at least the amount of oxygen in the stoichiometric composition in the film (bulk). For example, in the case where a silicon oxide film is used as the oxide insulating film 436, the composition formula is $SiO_{2+\alpha}$ ($\alpha>0$). With such a film as the oxide insulating film 436, oxygen can be supplied to the oxide semiconductor film 403, leading to favorable characteristics. By supply of oxygen to the oxide semiconductor film 403, oxygen vacancies in the film can be repaired.

For example, when the oxide insulating film 436 containing much (excessive) oxygen, which serves as an oxygen supply source, is provided so as to be in contact with the oxide semiconductor film 403, oxygen can be supplied from the oxide insulating film 436 to the oxide semiconductor film 403. Heat treatment may be performed in the state where the oxide semiconductor film 403 and the oxide insulating film 436 are at least partly in contact with each other to supply oxygen to the oxide semiconductor film 403.

In order that hydrogen or water will be not contained in the oxide semiconductor film 403 as much as possible in the formation step of the oxide semiconductor film 403, it is preferable to heat the substrate provided with the oxide insulating film 436 in a preheating chamber in a sputtering apparatus as a pretreatment for formation of the oxide semiconductor film 403 so that impurities such as hydrogen and moisture adsorbed to the substrate and/or the oxide insulating film 436 are eliminated and evacuated. As an exhaustion unit provided in the preheating chamber, a cryopump is preferable.

Planarizing treatment may be performed on the region of the oxide insulating film 436 which is to be in contact with the oxide semiconductor film 403. The planarization treatment may be, but not particularly limited to, polishing treatment (such as a chemical mechanical polishing method), dry etching treatment, or plasma treatment.

As plasma treatment, for example, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to a surface of the oxide insulating film 436.

As the planarization treatment, polishing treatment, dry etching treatment, or plasma treatment may be performed plural times, or these treatments may be performed in combination. In the case where the treatments are combined, the order of steps is not particularly limited and may be set as appropriate depending on the roughness of the surface of the oxide insulating film 436.

The planarization treatment can be performed in the following manner, for example: a surface of the silicon oxide film used as the oxide insulating film 436 is subjected to polishing treatment by a chemical mechanical polishing method so that the average surface roughness ($R_a$) of the surface of the silicon oxide film can be approximately 0.15 nm.

Note that it is preferable that the oxide semiconductor film 403 be formed under a condition that much oxygen is contained therein during deposition (e.g., deposited by a sputtering method in a 100% oxygen atmosphere), so as to be a film containing much oxygen (preferably having a region where the oxygen content is in excess of that in the stoichiometric composition of the oxide semiconductor in a crystalline state).

In this embodiment, a target used for forming the oxide semiconductor film 403 by a sputtering method is a metal oxide target having a composition ratio of In:Ga:Zn=3:1:2 [atomic percentage], so that an In—Ga—Zn-based oxide film (IGZO film) is formed.

The relative density (fill rate) of the metal oxide target is greater than or equal to 90% and less than or equal to 100%, preferably greater than or equal to 95% and less than or equal to 99.9%. By using the metal oxide target with high relative density, a dense oxide semiconductor film can be formed.

It is preferable that a high-purity gas in which impurities such as hydrogen, water, a hydroxyl group, and hydride are reduced be used as a sputtering gas for the deposition of the oxide semiconductor film 403.

The substrate is held in a deposition chamber kept under reduced pressure. Then, residual moisture in the deposition chamber is removed, a sputtering gas from which hydrogen and moisture are removed is introduced, and the oxide semiconductor film 403 is formed over the substrate 400 using the above-described target. To remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. From the deposition chamber evacuated with a cryopump, for example, a hydrogen atom, a compound including a hydrogen atom such as water ($H_2O$) (preferably, also a compound including a carbon atom), and the like are removed; thus, the concentration of an impurity in the oxide semiconductor film 403 formed in the deposition chamber can be reduced.

The oxide insulating film 436 and the oxide semiconductor film 403 are preferably formed in succession without exposure to the air. When the oxide insulating film 436 and the oxide semiconductor film 403 are formed in succession without exposure to the air, impurities such as hydrogen and moisture can be prevented from being adsorbed onto the surface of the oxide insulating film 436.

Next, oxygen (including at least one of an oxygen radical, an oxygen atom, and an oxygen ion) is introduced to the oxide semiconductor film; thus, oxygen is supplied to the oxide semiconductor film 403. Oxygen can be introduced by an ion implantation method, an ion doping method, a plasma immersion ion implantation method, plasma treatment, or the like.

The step of introducing oxygen in the process of manufacturing the transistor 440a in this embodiment is preferably performed after formation of the oxide semiconductor film 403 before formation of the gate electrode layer 401. Oxygen may be introduced to the oxide semiconductor film 403 more than once.

In the step of introducing oxygen, oxygen may be directly introduced to the oxide semiconductor film 403 or introduced to the oxide semiconductor film 403 through another film such as the gate insulating film. An ion implantation method, an ion doping method, a plasma immersion ion implantation method, or the like may be employed in the case where oxygen is introduced to the oxide semiconductor film 403 through another film, whereas plasma treatment or the like can be employed in the case where oxygen is directly introduced to the oxide semiconductor film 403 in an exposed state.

In this embodiment, oxygen is implanted to the oxide semiconductor film 403 by an ion implantation method. By the implantation of oxygen, the oxide semiconductor film 403 having a region where the oxygen content is higher than that in the stoichiometric composition of the oxide semiconductor in a crystalline state is formed.

For example, it is preferable that the concentration of oxygen in the oxide semiconductor film 403 which is introduced in the step of introducing oxygen, is greater than or equal to $1\times10^{18}/cm^3$ and less than or equal to $3\times10^{21}/cm^3$. Such an oxygen-excessive region may exist in at least part of the oxide semiconductor film 403 (including its interface). Thus, by the introduction of oxygen, in a stack of the oxide insulating film 436, the oxide semiconductor film 403, and the gate insulating film 402, at least one of an interface between the oxide insulating film 436 and the oxide semiconductor film 403, the inside of the oxide semiconductor film 403, and an interface between the oxide semiconductor film 403 and the gate insulating film 402 contains oxygen.

The oxide semiconductor film 403 includes a region where the oxygen content is higher than that in the stoichiometric composition of the oxide semiconductor in a crystalline state. In that case, the oxygen content is preferably larger than that in the stoichiometric ratio of the oxide semiconductor. Alternatively, the oxygen content is higher than that of the oxide semiconductor in a single crystal state. In some cases, oxygen may exist between lattices of the oxide semiconductor. The composition of such an oxide semiconductor can be expressed by $InGaZn_mO_{m+3x}$ ($x>1$). For example, supposing that m=1, the value of 1+3x in $InGaZnO_{1+3x}$ ($x>1$) exceeds 4 in the case where the content of oxygen is excess.

Oxygen vacancies in the oxide semiconductor film 403 can be repaired by oxygen supplied to the oxide semiconductor film 403.

In the oxide semiconductor, oxygen is one of main component materials. Thus, it is difficult to accurately estimate the oxygen concentration of the oxide semiconductor film by a method such as secondary ion mass spectrometry (SIMS). In other words, it can be said that it is hard to determine whether oxygen is intentionally added to the oxide semiconductor film.

Incidentally, it is known that oxygen contains isotopes such as $^{17}O$ and $^{18}O$ and the proportions of $^{17}O$ and $^{18}O$ in all of the oxygen atoms in nature is about 0.037% and about 0.204%, respectively. That is to say, it is possible to measure the concentrations of these isotopes in the oxide semiconductor film by a method such as SIMS; thus, the oxygen concentration of the oxide semiconductor film may be able to be estimated more accurately by measuring the concentrations of these isotopes. Thus, the concentration of the isotope may be measured to determine whether oxygen is intentionally added to the oxide semiconductor film.

A film containing much oxygen may be used as the insulating film (such as the oxide insulating film 436 or the gate insulating film 402) which is in contact with the oxide semiconductor film 403 and oxygen may be directly introduced to the oxide semiconductor film 403; in this manner, a plurality of oxygen supply methods can be performed. Such a film containing much oxygen is not necessarily used as the insulating film (such as the oxide insulating film 436 or the gate insulating film 402) which is in contact with the oxide semiconductor film 403 in the case where oxygen is directly introduced to the oxide semiconductor film 403 as in this embodiment.

Next, the film-shaped oxide semiconductor film 403 is processed into the island-shaped oxide semiconductor film 403 by a photolithography process.

A resist mask for forming the island-shaped oxide semiconductor film 403 may be formed by an inkjet method. Formation of the resist mask by an inkjet method needs no photomask; thus, manufacturing cost can be reduced.

Note that as the etching of the oxide semiconductor film 403, dry etching, wet etching, or both of the dry etching and wet etching may be employed. As an etchant used for wet etching of the oxide semiconductor film 403, for example, a mixed solution of phosphoric acid, acetic acid, and nitric acid, or the like can be used. Alternatively, ITO-07N (produced by KANTO CHEMICAL CO., INC.) may be used. It is also possible to employ dry etching by an inductively coupled plasma (ICP) etching method. For example, an IGZO film can be processed into an island shape by an ICP etching method (etching conditions: an etching gas of $BCl_3:Cl_2=60$ sccm:20 sccm, a power of 450 W, a bias power of 100 W, and a pressure of 1.9 Pa).

Further, heat treatment may be performed on the oxide semiconductor film 403 to remove excess hydrogen (including water and a hydroxyl group) (to perform dehydration or dehydrogenation treatment). The temperature of the heat treatment is higher than or equal to 300° C. and lower than or equal to 700° C., or lower than the strain point of the substrate. The heat treatment can be performed under reduced pressure, a nitrogen atmosphere, or the like. For example, the substrate is put in an electric furnace which is one of heat treatment apparatuses, and the oxide semiconductor film 403 is subjected to heat treatment at 450° C. in a nitrogen atmosphere for one hour.

The heat treatment apparatus is not limited to an electric furnace and a device for heating an object to be processed by heat conduction or heat radiation from a heating element such as a resistance heating element may be alternatively used. For example, a rapid thermal anneal (RTA) apparatus such as a gas rapid thermal anneal (GRTA) apparatus or a lamp rapid thermal anneal (LRTA) apparatus can be used. An LRTA apparatus is an apparatus for heating an object to be processed by radiation of light (electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperatures of 650° C. to 700° C., is heated for several minutes, and is taken out of the inert gas.

Note that in the heat treatment, it is preferable that water, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor film 403 is heated by the heat treatment, a high-purity oxygen gas, a high-purity $N_2O$ gas, or ultra dry air (the moisture amount is less than or equal to 20 ppm (−55° C. by conversion into a dew point), preferably less than or equal to 1 ppm, further preferably less than or equal to 10 ppb according to the measurement with a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). The oxygen gas or the $N_2O$ gas acts to supply oxygen that is a main component material of the oxide semiconductor and that is reduced by the step for removing an impurity for dehydration or dehydrogenation, so that the oxide semiconductor film 403 can be a high-purified, i-type (intrinsic) oxide semiconductor film.

Note that the heat treatment for dehydration or dehydrogenation may be performed after the formation of the film-shaped oxide semiconductor film 403 or after the formation of the island-shaped oxide semiconductor film 403.

The heat treatment for dehydration or dehydrogenation may be performed plural times and may be combined with another heat treatment.

When the heat treatment for dehydration or dehydrogenation is performed in the state where the oxide insulating film 436 is covered with the film-shaped oxide semiconductor film 403 which has not been processed into the island-shaped oxide semiconductor film 403, oxygen contained in the oxide insulating film 436 can be prevented from being released by the heat treatment, which is preferable.

The dehydration or dehydrogenation treatment may be accompanied by elimination of oxygen which is a main component material of the oxide semiconductor to lead to a reduction in oxygen. An oxygen vacancy exists in a portion where oxygen is eliminated in an oxide semiconductor film, and a donor level which leads to a change in the electrical characteristics of a transistor is formed owing to the oxygen vacancy.

Thus, oxygen is preferably supplied to the oxide semiconductor film 403 in the case where the dehydration or dehydrogenation treatment is performed. By supply of oxygen to the oxide semiconductor film 403, oxygen vacancies in the film can be repaired.

Accordingly, dehydration or dehydrogenation treatment is preferably performed before the addition of oxygen to the oxide semiconductor film 403.

An oxide insulating film containing much (excessive) oxygen, which serves as an oxygen supply source, may be provided so as to be in contact with the oxide semiconductor film 403, whereby oxygen can be supplied from the oxide insulating film to the oxide semiconductor film 403. In the above structure, heat treatment may be performed in the state where the oxide semiconductor film 403 which has been subjected to the heat treatment and the oxide insulating film are at least partly in contact with each other to supply oxygen to the oxide semiconductor film.

By removing hydrogen or moisture from the oxide semiconductor to highly purify the oxide semiconductor so as not to contain impurities as much as possible, and supplying oxygen to repair oxygen vacancies therein, the oxide semiconductor can be turned into an i-type (intrinsic) oxide semiconductor or a substantially i-type (intrinsic) oxide semiconductor. This enables the Fermi level ($E_f$) of the oxide semiconductor to be at the same level as the intrinsic Fermi level ($E_i$) thereof. Accordingly, by using the oxide semiconductor film for a transistor, fluctuation in the threshold voltage Vth of the transistor due to an oxygen vacancy and a shift of the threshold voltage ΔVth can be reduced.

Next, a gate insulating film 442 covering the oxide semiconductor film 403 is formed.

Note that a surface of the oxide semiconductor film 403 may also be subjected to the planarization treatment to improve the coverage with the gate insulating film 442. The surface of the oxide semiconductor film 403 is preferably flat particularly in the case where a thin insulating film is used as the gate insulating film 442.

The gate insulating film 442 can be formed to have a thickness greater than or equal to 1 nm and less than or equal to 20 nm by a sputtering method, an MBE method, a CVD method, a pulsed laser deposition method, an ALD method, or the like as appropriate. The gate insulating film 442 may be formed with a sputtering apparatus which performs deposition on surfaces of a plurality of substrates set substantially perpendicular to a surface of a sputtering target.

As the gate insulating film 442, a silicon oxide film, a gallium oxide film, an aluminum oxide film, a silicon nitride film, a silicon oxynitride film, an aluminum oxynitride film, or a silicon nitride oxide film can be used. It is preferable that a portion of the gate insulating film 442 which is in contact with the oxide semiconductor film 403 contain oxygen. In particular, the gate insulating film 442 preferably contains a large amount of oxygen which exceeds at least the amount of oxygen in the stoichiometric ratio in the film (bulk). For example, in the case where a silicon oxide film is used as the gate insulating film 442, the composition formula is $SiO_{2+\alpha}$ ($\alpha>0$). In this embodiment, a silicon oxide film of $SiO_{2+\alpha}$ ($\alpha>0$) is used as the gate insulating film 442. The use of the silicon oxide film as the gate insulating film 442 makes it possible to supply oxygen to the oxide semiconductor film 403, which leads to favorable characteristics. Further, the gate insulating film 442 is preferably formed in consideration of the size of a transistor to be formed and the step coverage with the gate insulating film 442.

The gate insulating film 442 can be formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, whereby gate leakage current can be reduced. Further, the gate insulating film 442 may have either a single-layer structure or a stacked-layer structure.

Then, a conductive film is formed over the gate insulating film 442 and then etched, so that the gate electrode layer 401 is formed.

The gate electrode layer 401 can be formed using a metal material such as molybdenum, titanium, tantalum, tungsten, aluminum, copper, chromium, neodymium, or scandium or an alloy material which contains any of these materials as its main component. A semiconductor film typified by a poly-crystalline silicon film doped with an impurity element such as phosphorus, or a silicide film of nickel silicide or the like can also be used as the gate electrode layer 401. The gate electrode layer 401 has either a single-layer structure or a stacked-layer structure.

The gate electrode layer 401 can also be formed using a conductive material such as indium oxide-tin oxide, indium oxide containing tungsten oxide, indium zinc oxide containing tungsten oxide, indium oxide containing titanium oxide, indium tin oxide containing titanium oxide, indium oxide-zinc oxide, or indium tin oxide to which silicon oxide is added. It is also possible that the gate electrode layer 401 has a stacked-layer structure of the above conductive material and the above metal material.

As one layer of the gate electrode layer 401 which is in contact with the gate insulating film 442, a metal oxide film containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used. These films each have a work function of 5 eV or higher, preferably 5.5 eV or higher, which enables the threshold voltage in the electrical characteristics of the transistor to take a positive value when used as the gate electrode layer, so that a switching element of what is called normally-off type can be achieved.

Figure 2A:
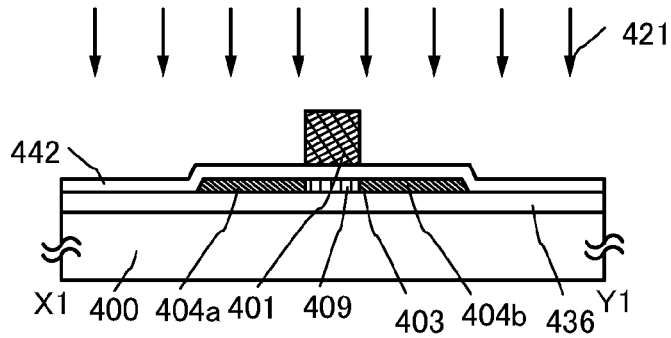
FIGS. 2A to 2D are cross-sectional views illustrating one embodiment of a method for manufacturing a semiconductor device.
Figure 2B:
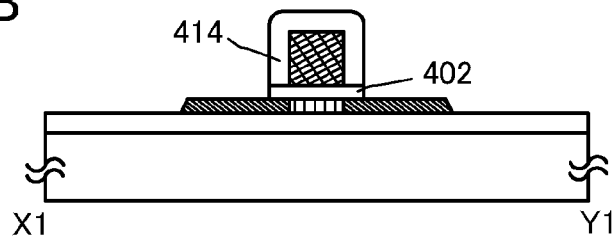

Next, a dopant 421 is introduced to the oxide semiconductor film 403 using the gate electrode layer 401 as a mask, whereby the low-resistance regions 404a and 404b are formed (see FIG. 2A).

The dopant 421 is an impurity by which the electrical conductivity of the oxide semiconductor film 403 is changed. One or more selected from the following can be used as the dopant 421: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (CO, titanium (Ti), and zinc (Zn).

Alternatively, the dopant 421 can be introduced to the oxide semiconductor film 403 through another film (e.g., the gate insulating film 402) by an implantation method. As the method for introducing the dopant 421, an ion implantation method, an ion doping method, a plasma immersion ion implantation method, or the like can be used. In that case, it is preferable to use a single ion of the dopant 421, or a fluoride ion or chloride ion thereof.

The introduction of the dopant 421 may be controlled by setting the implantation conditions such as the accelerated voltage and the dosage, or the thickness of the film through which the dopant passes as appropriate. In this embodiment, phosphorus is used as the dopant 421, whose ion is implanted by an ion implantation method. Note that the dosage of the dopant 421 may be greater than or equal to $1\times10^{13}$ ions/cm$^2$ and less than or equal to $5\times10^{16}$ ions/cm$^2$.

The concentration of the dopant 421 in the low-resistance regions is preferably greater than or equal to $5\times10^{18}$/cm$^3$ and less than or equal to $1\times10^{22}$/cm$^3$.

The dopant 421 may be introduced while the substrate 400 is heated.

The introduction of the dopant 421 into the oxide semiconductor film 403 may be performed plural times, and plural kinds of dopant may be used.

Further, heat treatment may be performed after the introduction of the dopant 421. The heat treatment is preferably performed at a temperature higher than or equal to 300° C. and lower than or equal to 700° C., further preferably higher than or equal to 300° C. and lower than or equal to 450° C., under an oxygen atmosphere for one hour. The heat treatment may be performed under a nitrogen atmosphere, reduced pressure, or the air (ultra-dry air).

In this embodiment, phosphorus (P) ions are implanted to the oxide semiconductor film 403 by an ion implantation method. Note that the conditions of the phosphorus (P) ion implantation are as follows: an acceleration voltage of 30 kV and a dosage of $1.0\times10^{15}$ ions/cm$^2$.

In the case where the oxide semiconductor film 403 is a CAAC-OS film, the oxide semiconductor film 403 may be partly made amorphous by the introduction of the dopant 421. In that case, the crystallinity of the oxide semiconductor film 403 can be recovered by performing heat treatment thereon after the introduction of the dopant 421.

Thus, the oxide semiconductor film 403 in which the low-resistance regions 404a and 404b are formed with the channel formation region 409 provided therebetween is formed.

Next, an insulating film including an aluminum oxide film which covers the gate electrode layer 401 is formed and then etched, so that the insulating film 414 including an aluminum oxide film is formed. After that, the gate insulating film 442 is etched with the gate electrode layer 401 and the insulating film 414 including an aluminum oxide film used as a mask, so that the gate insulating film 402 is formed (see FIG. 2B).

The insulating film 414 including an aluminum oxide film may be either a single layer or a stacked layer as long as an aluminum oxide film is included.

The insulating film 414 including an aluminum oxide film can be formed by a plasma CVD method, a sputtering method, an evaporation method, or the like.

For the insulating film 414 including an aluminum oxide film, an inorganic insulating film such as a silicon oxide film, a silicon oxynitride film, an aluminum oxynitride film, or a gallium oxide film can be typically used as well as an aluminum oxide film. A hafnium oxide film, a magnesium oxide film, a zirconium oxide film, a lanthanum oxide film, a barium oxide film, or a metal nitride film (e.g., an aluminum nitride film) can also be used.

In this embodiment, an aluminum oxide film is formed as the insulating film 414 including an aluminum oxide film by a sputtering method. The insulating film 414 including an aluminum oxide film can be deposited by a sputtering method under a rare gas (typically, argon) atmosphere, an oxygen atmosphere, or a mixed atmosphere of a rare gas and oxygen.

The insulating film 414 including an aluminum oxide film is preferably formed appropriately using a method in which impurities such as water and hydrogen can be prevented from entering the insulating film.

To remove residual moisture from the deposition chamber of the insulating film 414 including an aluminum oxide film in a manner similar to the deposition of the oxide semiconductor film, an entrapment vacuum pump (such as a cryopump) is preferably used. The concentration of impurities contained in the insulating film 414 including an aluminum oxide film which is formed in the deposition chamber exhausted using a cryopump can be reduced. In addition, as an evacuation unit for removing moisture remaining in the deposition chamber of the insulating film 414 including an aluminum oxide film, a turbo molecular pump provided with a cold trap may be used.

A high-purity gas from which impurities such as hydrogen, water, a hydroxyl group, and hydride have been removed is preferably used as a sputtering gas for the deposition of the insulating film 414 including an aluminum oxide film.

The aluminum oxide film which is used as the insulating film 414 including an aluminum oxide film and provided over the oxide semiconductor film 403 has a superior shielding effect (blocking effect), which is not permeable to either oxygen and an impurity such as hydrogen or moisture.

Thus, during the manufacturing process and after the manufacture, the aluminum oxide film functions as a protective film for preventing entry of impurities such as hydrogen and moisture, which can cause a change, into the oxide semiconductor film 403 and release of oxygen, which is a main component material of the oxide semiconductor, from the oxide semiconductor film 403. Accordingly, the transistor 440a can have stable electrical characteristics.

The interlayer insulating film 415 is formed over the oxide semiconductor film 403, the gate insulating film 402, the gate electrode layer 401, and the insulating film 414 including an aluminum oxide film. The interlayer insulating film 415 is preferably thick enough to planarize unevenness of the transistor 440a. In this embodiment, a silicon oxynitride film formed by a CVD method is used.

As the interlayer insulating film 415, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be typically used. The interlayer insulating film 415 can be formed by a plasma CVD method, a sputtering method, or the like.

Further, a planarization insulating film may be formed in order to reduce surface roughness due to the transistor. For the planarization insulating film, an organic material such as polyimide, acrylic, or benzocyclobutene can be used. Other than such organic materials, it is also possible to use a low-dielectric constant material (low-k material) or the like. Note that the planarization insulating film may be formed by stacking a plurality of insulating films formed from these materials.

Figure 2C:
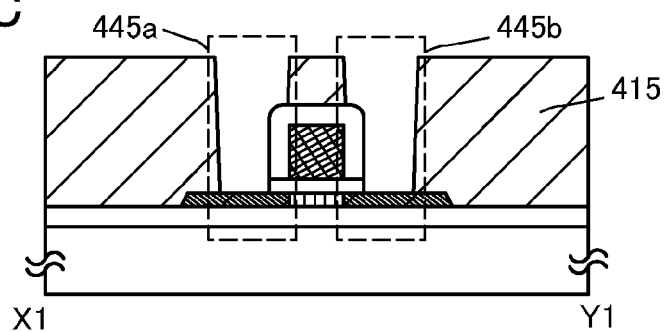

Openings 445a and 445b are formed in the interlayer insulating film 415 so that the oxide semiconductor film 403 (low-resistance regions 404a and 404b), the gate insulating film 402, and part of the top surface and a side surface of the insulating film 414 including an aluminum oxide film are exposed (see FIG. 2C).

The openings 445a and 445b may be formed by performing etching treatment twice using two masks.

At the time of forming the openings 445a and 445b, the insulating film 414 including an aluminum oxide film functions as an etching stopper, so that the gate electrode layer 401 is not exposed. Accordingly, the etching step for forming the openings 445a and 445b is performed under a condition (e.g., an etching condition or materials of the interlayer insulating film 415 and the insulating film 414 including an aluminum oxide film) that the etching selectivity of the interlayer insulating film 415 to the insulating film 414 including an aluminum oxide film is high.

The source electrode layer 405a and the drain electrode layer 405b are formed in the openings 445a and 445b, respectively. The transistor is connected to another transistor with the use of the source electrode layer 405a and the drain electrode layer 405b, so that a variety of circuits can be formed.

The source electrode layer 405a and the drain electrode layer 405b can be formed using a material and a method which are similar to those for the gate electrode layer 401. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A film of a high-melting-point metal such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. As the conductive film used for forming the source electrode layer 405a and the drain electrode layer 405b, a conductive metal oxide may be used. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

For example, as the source electrode layer 405a and the drain electrode layer 405b, a single layer of a molybdenum film, a stack of a tantalum nitride film and a copper film, a stack of a tantalum nitride film and a tungsten film, or the like can be used.

Figure 2D:
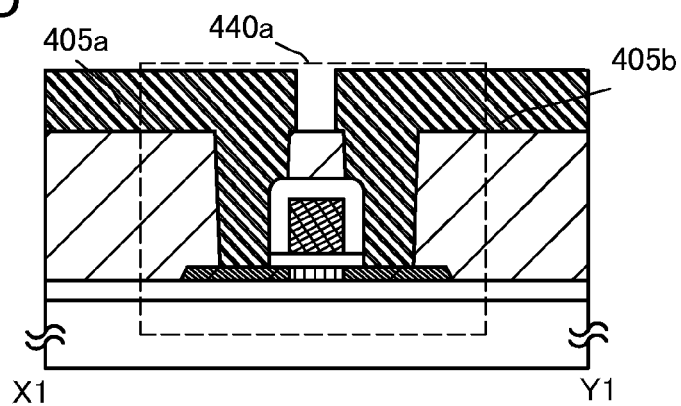

Through the above-described process, the transistor 440a of this embodiment is manufactured (see FIG. 2D).

Figure 4A:
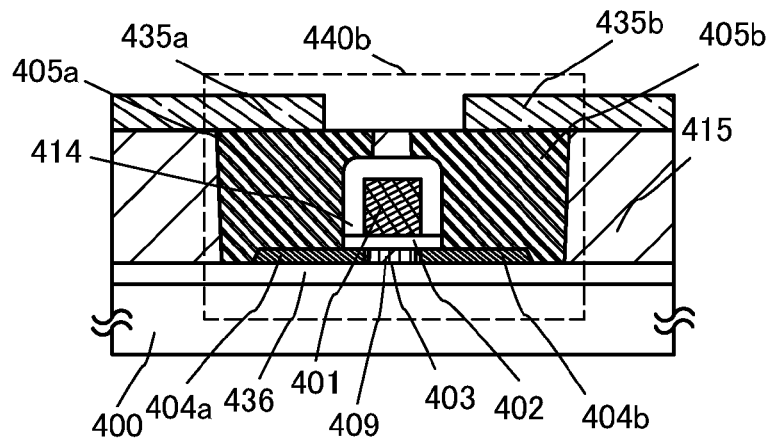
FIGS. 4A to 4C are cross-sectional views each illustrating one embodiment of a semiconductor device.

Alternatively, as in a transistor 440b illustrated in FIG. 4A, the source electrode layer 405a and the drain electrode layer 405b may be subjected to polishing treatment by a chemical mechanical polishing method, and part of the source electrode layer 405a and the drain electrode layer 405b may be removed so that the interlayer insulating film 415 is exposed. In the transistor 440b, the source electrode layer 405a and the drain electrode layer 405b are not protruded from a surface of the interlayer insulating film 415 but embedded in the interlayer insulating film 415. In addition, wiring layers 435a and 435b can be provided in contact with the source electrode layer 405a and the drain electrode layer 405b, respectively. The width between the wiring layer 435a and the wiring layer 435b can be wider than the width between the source electrode layer 405a and the drain electrode layer 405b in the channel length direction; thus, the process can be facilitated.

The wiring layer 435a and the wiring layer 435b can be formed using a material and a method which are similar to those for the gate electrode layer 401, the source electrode layer 405a, or the drain electrode layer 405b. For example, a metal film containing an element selected from Al, Cr, Cu, Ta, Ti, Mo, and W, or a metal nitride film containing any of the above elements as a component (a titanium nitride film, a molybdenum nitride film, or a tungsten nitride film) can be used. A film of a high-melting-point metal such as Ti, Mo, W, or the like or a metal nitride film of any of these elements (a titanium nitride film, a molybdenum nitride film, and a tungsten nitride film) may be stacked on one of or both of a lower side and an upper side of a metal film of Al, Cu, or the like. As the conductive film used for forming the wiring layer 435a and the wiring layer 435b, a conductive metal oxide may be used. As the conductive metal oxide, indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these metal oxide materials in which silicon oxide is contained can be used.

To remove part of the source electrode layer 405a and the drain electrode layer 405b, a different cutting (grinding or polishing) method can be employed other than a chemical mechanical polishing method. Alternatively, a cutting (grinding or polishing) method such as a chemical mechanical polishing method may be employed in combination with an etching (dry etching or wet etching) method, plasma treatment, or the like. For example, after the removal step is performed by a chemical mechanical polishing method, dry etching or plasma treatment (e.g., reverse sputtering) may be performed to improve the planarity of a surface to be processed. In the case where a cutting (grinding or polishing) method is employed in combination with an etching method, plasma treatment, or the like, the order of the steps is not particularly limited, and may be set as appropriate depending on the material, thickness, and unevenness of surface of the source electrode layer 405a and the drain electrode layer 405b.

Figure 4B:
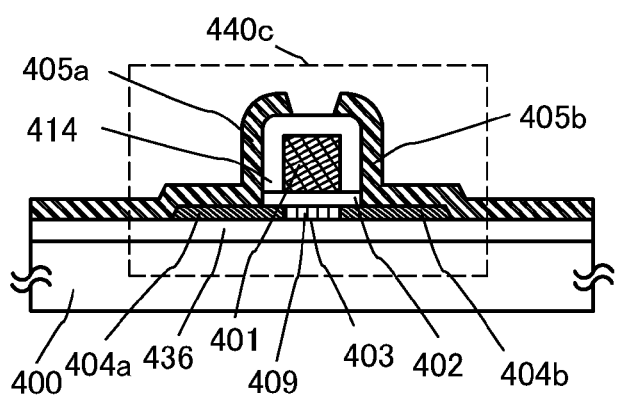

As in a transistor 440c illustrated in FIG. 4B, a structure in which the interlayer insulating film 415 is not provided may be employed.

In each of the transistors 440a, 440b, and 440c in this embodiment, the source electrode layer 405a and the drain electrode layer 405b are in contact with the exposed top surface of the oxide semiconductor film 403 and part of the top surface and the side surface of the insulating film 414 including an aluminum oxide film.

Since the top surface and the side surface of the gate electrode layer 401 are covered with the insulating film 414 including an aluminum oxide film, electrical failure such as a short circuit between the gate electrode layer 401 and the source electrode layer 405a or the drain electrode layer 405b can be prevented owing to the insulating film 414 including an aluminum oxide film even when the source electrode layer 405a and the drain electrode layer 405b overlap with the top surface of the gate electrode layer 401. Accordingly, the transistors 440a, 440b, and 440c each having a miniaturized structure can be manufactured with high yield.

The distance between the gate electrode layer 401 and a region (contact region) where the oxide semiconductor film 403 is in contact with the source electrode layer 405a or the drain electrode layer 405b correspond to the width of the insulating film 414 including an aluminum oxide film in the channel length direction. Thus, further miniaturization can be achieved and the distance between the gate electrode layer and the contact region can be controlled in the manufacturing process with less variation.

Figure 4C:
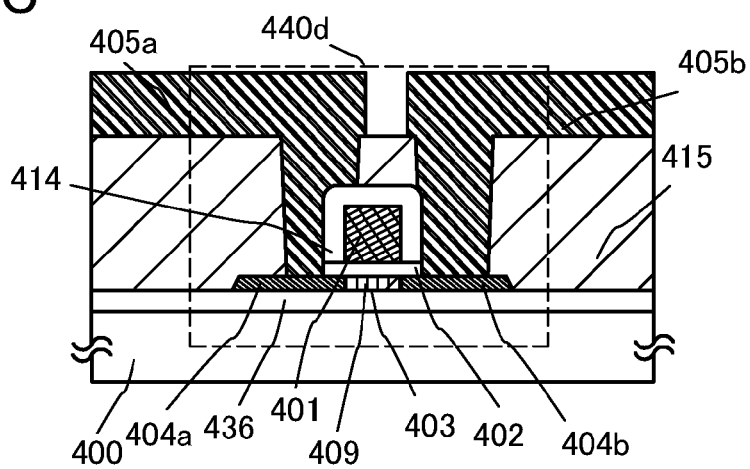

Accordingly, even when the openings 445a and 445b for providing the source electrode layer 405a and the drain electrode layer 405b therein, which are formed in the interlayer insulating film 415, are slightly displaced in the manufacturing process as in a transistor 440d illustrated in FIG. 4C, for example, the distance between the gate electrode layer 401 and the region (contact region) where the oxide semiconductor film 403 is in contact with the source electrode layer 405a or the drain electrode layer 405b is not changed. Thus, electrical failure and variation in the electrical characteristics of the transistor 440d, which occur in the manufacturing process, can be reduced.

As described above, the distance between the gate electrode layer 401 and the region (contact region) where the oxide semiconductor film 403 is in contact with the source electrode layer 405a or the drain electrode layer 405b can be short; thus, the resistance between the gate electrode layer 401 and the region (contact region) where the oxide semiconductor film 403 is in contact with the source electrode layer 405a or the drain electrode layer 405b is reduced. As a result, on-state characteristics of the transistors 440a, 440b, 440c, and 440d can be improved.

In the above manner, the transistors 440a, 440b, 440c, and 440d in semiconductor devices, each of which has less variation in characteristics, a miniaturized structure, and improved on-state characteristics can be manufactured with high yield.

Accordingly, a miniaturized semiconductor device which has excellent electrical characteristics and a method for manufacturing the semiconductor device can be provided.

Embodiment 2

In this embodiment, another embodiment of a semiconductor device and a method for manufacturing the semiconductor device will be described with reference to FIGS. 5A to 5C. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. Thus, the descriptions thereof are not repeated in this embodiment.

Figure 5A:
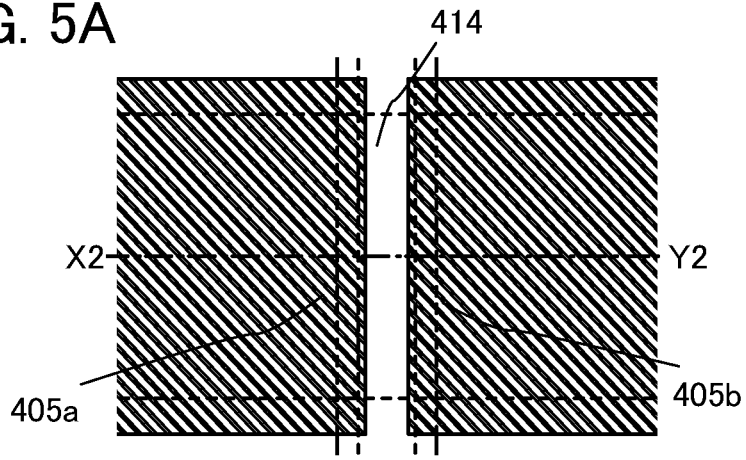
FIGS. 5A to 5C are a plan view and cross-sectional views illustrating embodiments of a semiconductor device.
Figure 5B:
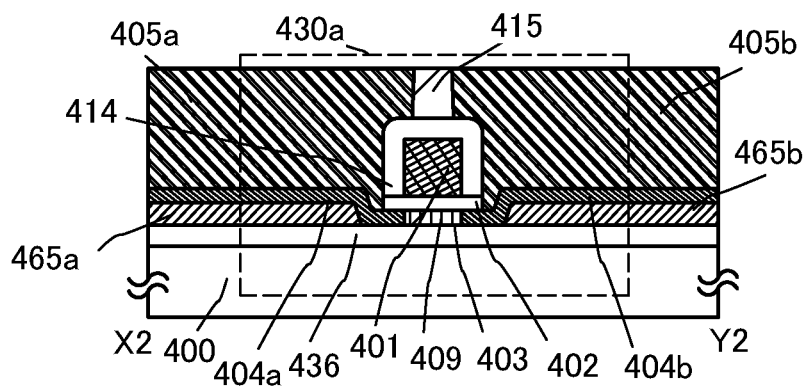
Figure 5C:
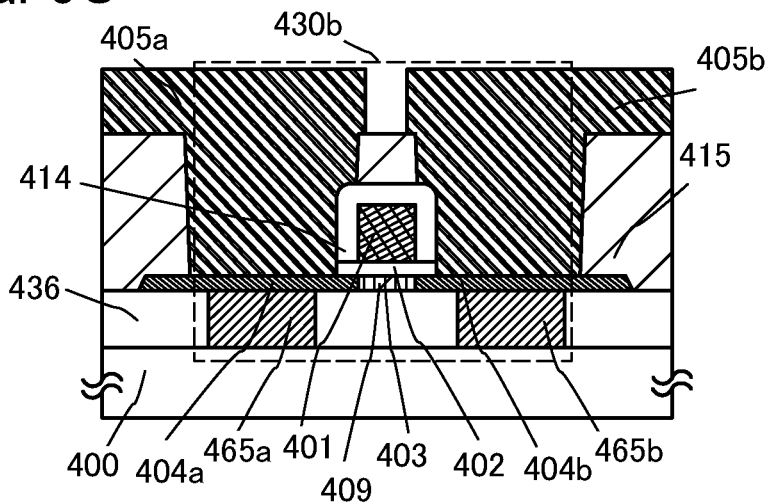

Transistors 430a and 430b illustrated in FIGS. 5A to 5C are examples of a top-gate transistor. FIG. 5A is a plan view of the transistor 430a and FIG. 5B is a cross-sectional view taken along dashed line X2-Y2 in FIG. 5A. Note that in FIG. 5A, the interlayer insulating film 415 is not illustrated. FIG. 5C is a cross-sectional view of the transistor 430b.

As illustrated in FIGS. 5B and 5C, which are cross-sectional views in the channel length direction, a semiconductor device including the transistor 430a or the transistor 430b includes, over the substrate 400 having an insulating surface over which the oxide insulating film 436 is provided, electrode layers 465a and 465b; the oxide semiconductor film 403 including the channel formation region 409 and the low-resistance regions 404a and 404b, which is in contact with the electrode layer 465a and the electrode layer 465b; the gate insulating film 402; the gate electrode layer 401; the insulating film 414 including an aluminum oxide film which covers the top surface and the side surface of the gate electrode layer 401; the interlayer insulating film 415; the source electrode layer 405a; and the drain electrode layer 405b.

The transistors 430a and 430b described in this embodiment are examples in each of which, below the oxide semiconductor film 403, the electrode layers 465a and 465b are in contact with the low-resistance regions 404a and 404b, respectively, and the electrode layers 465a and 465b are provided so as to overlap with the source electrode layer 405a and the drain electrode layer 405b, respectively.

In the transistor 430a illustrated in FIGS. 5A and 5B, the island-shaped electrode layers 465a and 465b are provided over the oxide insulating film 436, and the oxide semiconductor film 403 is provided on and in contact with the electrode layers 465a and 465b. The electrode layers 465a and 465b are in contact with the low-resistance regions 404a and 404b in the oxide semiconductor film 403, respectively, and overlap with the source electrode layer 405a or the drain electrode layer 405b. Note that in the transistor 430a, the source electrode layer 405a and the drain electrode layer 405b are subjected to polishing treatment. The levels of the surface of the interlayer insulating film 415 and surfaces of the source electrode layer 405a and the drain electrode layer 405b (the levels from a surface of the substrate 400) are substantially the same.

In the transistor 430b illustrated in FIG. 5C, the island-shaped electrode layers 465a and 465b are provided so as to be embedded in the oxide insulating film 436, and the oxide semiconductor film 403 is provided on and in contact with the electrode layers 465a and 465b. The electrode layers 465a and 465b are in contact with the low-resistance regions 404a and 404b in the oxide semiconductor film 403, respectively, and overlaps with the source electrode layer 405a or the drain electrode layer 405b.

When the electrode layers 465a and 465b are provided below the oxide semiconductor film 403 so as to each overlap with the region where the oxide semiconductor film 403 is in contact with the source electrode layer 405a or the drain electrode layer 405b (contact region), the contact resistance between the oxide semiconductor film 403 and the source electrode layer 405a or the drain electrode layer 405b can be reduced. Accordingly, on-state characteristics of the transistors 430a and 430b can be improved.

The electrode layer 465a can be used as a source terminal of the transistor 430a or 430b and the electrode layer 465b can be used as a drain terminal of the transistor 430a or 430b.

The electrode layers 465a and 465b are formed using a metal material such as molybdenum, titanium, tantalum, tungsten, aluminum, copper, chromium, neodymium, or scandium; a metal nitride film which contains any of these elements (e.g., a titanium nitride film, a molybdenum nitride film, or a tungsten nitride film); or the like. The electrode layers 465a and 465b may also be formed using an oxide semiconductor, and can be formed to have a single-layer structure or a stacked-layer structure using any of the above materials.

For the oxide semiconductor, an In—Ga—Zn-based oxide (also referred to as IGZO), indium oxide ($In_2O_3$), tin oxide ($SnO_2$), zinc oxide (ZnO), indium oxide-tin oxide ($In_2O_3$—$SnO_2$), indium oxide-zinc oxide ($In_2O_3$—ZnO), or any of these oxide semiconductor materials in which silicon oxide is contained can be used.

Note that in the case where an oxide semiconductor material is employed for forming the electrode layer 465a and the electrode layer 465b, it is necessary, at the time of processing the oxide semiconductor film 403 into an island shape, to use a material that can have etching selectivity at least between the oxide semiconductor film 403 and the electrode layers 465a and 465b which are not covered by the oxide insulating film 436 so that the electrode layers 465a and 465b are not etched as much as possible. However, the electrode layers 465a and 465b are partly etched depending on the etching condition. Alternatively, the electrode layers 465a and 465b can be formed using a conductive material or a semiconductor material into which a dopant (impurity element) is introduced to have lower resistance.

In the case where the electrode layers 465a and 465b are formed using an oxide semiconductor material, the interfaces between the oxide semiconductor film and the electrode layers 465a and 465b are unclear depending on the material or the film formation conditions of the oxide semiconductor layer in some cases. Further, in the case where the interfaces are unclear, a portion which can be called a mixed region or a mixed layer of the oxide semiconductor film and the electrode layers 465a and 465b is formed in some cases.

There is no particular limitation on the sizes and the thicknesses of the electrode layers 465a and 465b, as long as at least part of the electrode layers 465a and 465b overlap with the source electrode layer 405a or the drain electrode layer 405b.

However, in the case where the electrode layers 465a and 465b are provided over the oxide insulating film 436 as in the transistor 430a, the thicknesses of the electrode layers 465a and 465b are preferably not too large and the electrode layers 465a and 465b preferably have tapered end portions, in consideration of the coverage with the oxide semiconductor film 403, which is a thin film, formed thereover.

In contrast, as in the transistor 430b, in the case where the electrode layers 465a and 465b are embedded in the oxide insulating film 436 and the surfaces thereof are subjected to polishing treatment, the electrode layers 465a and 465b preferably have large thicknesses to have low resistance.

The interlayer insulating film 415 planarizes unevenness of the transistor 430a or 430b and includes openings exposing the low-resistance regions 404a and 404b, the insulating film 414 including an aluminum oxide film, and the gate insulating film 402. In the openings, the source electrode layer 405a and the drain electrode layer 405b are provided in contact with the low-resistance regions 404a and 404b in the oxide semiconductor film 403, the gate insulating film 402, and part of the top surface and a side surface of the insulating film 414 including an aluminum oxide film.

In this embodiment, an aluminum oxide film is used as the insulating film 414 including an aluminum oxide film.

Since the top surface and the side surface of the gate electrode layer 401 are covered with the insulating film 414 including an aluminum oxide film, electrical failure such as a short circuit between the gate electrode layer 401 and the source electrode layer 405a or the drain electrode layer 405b can be prevented owing to the insulating film 414 including an aluminum oxide film even when the source electrode layer 405a and the drain electrode layer 405b overlap with the top surface of the gate electrode layer 401. Accordingly, the transistors 430a and 430b each having a miniaturized structure can be manufactured with high yield.

In the manufacturing process of the semiconductor device, oxygen (which includes at least one of an oxygen radical, an oxygen atom, and an oxygen ion) may be introduced to the oxide semiconductor film 403 to supply the oxygen to the oxide semiconductor film. Oxygen can be introduced by an ion implantation method, an ion doping method, a plasma immersion ion implantation method, plasma treatment, or the like.

It is preferable that the oxide semiconductor film 403 in each of the transistors 430a and 430b include a region where the oxygen content is higher than that in the stoichiometric composition of the oxide semiconductor in a crystalline state. In that case, the oxygen content is preferably larger than that in the stoichiometric ratio of the oxide semiconductor. Alternatively, the oxygen content is higher than that of the oxide semiconductor in a single crystal state. In some cases, oxygen may exist between lattices of the oxide semiconductor.

When the top surface and the side surface of the gate electrode layer 401 are covered with the insulating film 414 including an aluminum oxide film, the channel formation region 409 and part of the low-resistance regions 404a and 404b in the oxide semiconductor film 403, which overlap with the gate electrode layer 401, can be covered with the insulating film 414 including an aluminum oxide film.

The insulating film including an aluminum oxide film has a superior shielding effect (blocking effect), which is not permeable to either oxygen or impurities such as hydrogen or moisture.

Thus, during the manufacturing process and after the manufacture, the insulating film 414 including an aluminum oxide film functions as a protective film for preventing entry of impurities such as hydrogen and moisture, which can cause a change, into the oxide semiconductor film and release of oxygen, which is a main component material of the oxide semiconductor, from the oxide semiconductor film. Accordingly, the transistors 430a and 430b can have stable electrical characteristics.

The low-resistance regions 404a and 404b whose resistances are lower than that of the channel formation region 409 and which include a dopant are formed in the oxide semiconductor film 403 so that the channel formation region 409 is sandwiched between the low-resistance regions 404a and 404b, by introducing the dopant into the oxide semiconductor film 403 in a self-aligning manner with the use of the gate electrode layer 401 as a mask. The dopant is an impurity by which the conductivity of the oxide semiconductor film 403 is changed. As the method for introducing the dopant, an ion implantation method, an ion doping method, a plasma immersion ion implantation method, or the like can be used.

With the oxide semiconductor film 403 including the low-resistance regions 404a and 404b between which the channel formation region 409 is provided in the channel length direction, on-state characteristics (e.g., on-state current and field-effect mobility) of the transistors 430a and 430b are increased, which enables high-speed operation and high-speed response of the transistors.

The transistors 430a and 430b in semiconductor devices, each of which has less variation in characteristics, a miniaturized structure, and improved on-state characteristics can be manufactured with high yield.

Accordingly, a miniaturized semiconductor device which has excellent electrical characteristics and a method for manufacturing the semiconductor device can be provided.

The structures, methods, and the like described in this embodiment can be combined as appropriate with any of the structures, methods, and the like described in the other embodiments.

Embodiment 3

In this embodiment, an example of a semiconductor device which includes the transistor described in this specification, which can hold stored data even when not powered, and which does not have a limitation on the number of write cycles, will be described with reference to drawings.

Figure 6A:
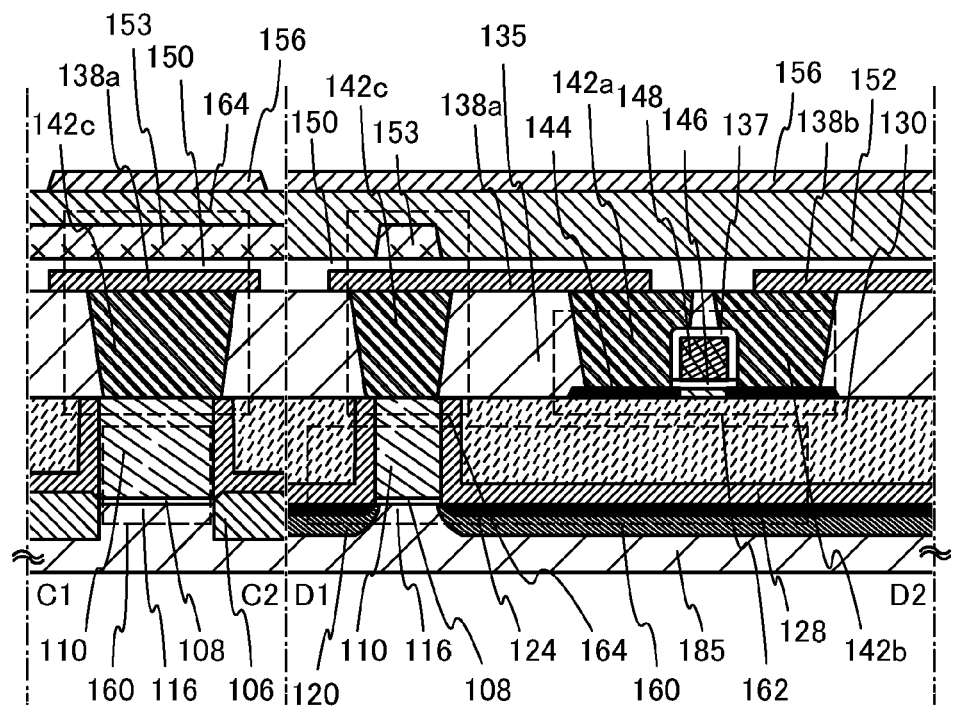
FIGS. 6A to 6C are a cross-sectional view, a plan view, and a circuit diagram illustrating one embodiment of a semiconductor device.
Figure 6B:
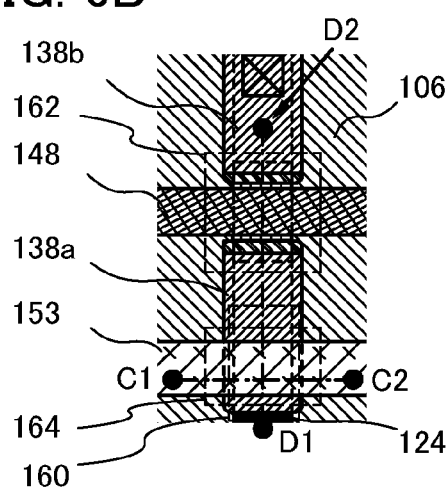
Figure 6C:
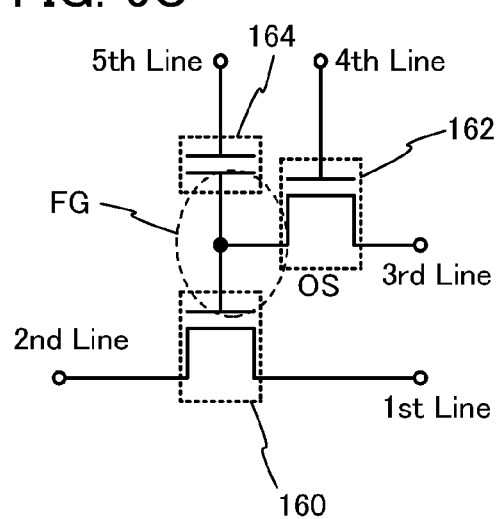

FIGS. 6A to 6C illustrate an example of the structure of a semiconductor device. FIGS. 6A to 6C illustrate a cross-sectional view, a plan view, and a circuit diagram, respectively, of the semiconductor device. Here, FIG. 6A corresponds to cross sections taken along line C1-C2 and line D1-D2 in FIG. 6B.

The semiconductor device illustrated in FIGS. 6A and 6B includes a transistor 160 including a first semiconductor material in a lower portion, and a transistor 162 including a second semiconductor material in an upper portion. The structure of the transistor described in Embodiment 1 or Embodiment 2 can be applied to the transistor 162. This embodiment shows an example where the structure of the transistor 440b described in Embodiment 1 is applied to that of the transistor 162.

Here, the first semiconductor material and the second semiconductor material are preferably materials having different band gaps. For example, the first semiconductor material may be a semiconductor material other than an oxide semiconductor (e.g., silicon) and the second semiconductor material may be an oxide semiconductor. A transistor including a semiconductor material other than an oxide semiconductor can operate at high speed easily. On the other hand, a transistor including an oxide semiconductor enables charge to be held for a long time owing to its characteristics.

Although the above-described transistors are n-channel transistors here, it is needless to say that p-channel transistors can also be used. The transistor 162 for holding information is not necessarily limited to the transistor formed using an oxide semiconductor, which is described in Embodiment 1. Further, the specific structure of the semiconductor device is not necessarily limited to those described here such as the material used for the semiconductor device and the condition of the semiconductor device.

The transistor 160 in FIG. 6A includes a channel formation region 116 provided in a substrate 185 containing a semiconductor material (e.g., silicon), impurity regions 120 provided so that the channel formation region 116 is sandwiched therebetween, intermetallic compound regions 124 in contact with the impurity regions 120, a gate insulating layer 108 provided over the channel formation region 116, and a gate electrode 110 provided over the gate insulating layer 108. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating layer 106 is provided over the substrate 185 so as to surround the transistor 160. An insulating layer 128 and an insulating layer 130 are provided so as to cover the transistor 160. Note that in the transistor 160, a sidewall insulating layer may be formed on a side surface of the gate electrode 110 and the impurity regions 120 may include a region having a different impurity concentration.

The transistor 160 formed using a single crystal semiconductor substrate can operate at high speed. Thus, when the transistor is used as a reading transistor, data can be read at high speed. Two insulating films are formed so as to cover the transistor 160. As treatment prior to formation of the transistor 162 and a capacitor 164, CMP treatment is performed on the two insulating films so that the insulating layer 128 and the insulating layer 130 are formed to be planarized and the top surface of the gate electrode 110 is exposed.

As each of the insulating layer 128 and the insulating layer 130, an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film can be used typically. The insulating layer 128 and the insulating layer 130 can be formed by a plasma CVD method, a sputtering method, or the like.

Alternatively, an organic material such as polyimide, an acrylic resin, or a benzocyclobutene resin can be used. Other than such organic materials, it is also possible to use a low-dielectric constant material (low-k material) or the like. In the case of using an organic material, a wet method such as a spin coating method or a printing method may be used to form the insulating layer 128 and the insulating layer 130.

Note that in this embodiment, a silicon nitride film is used as the insulating layer 128, and a silicon oxide layer is used as the insulating layer 130.

Planarization treatment is preferably performed on a region of a surface of the insulating layer 130, on which an oxide semiconductor film 144 is to be formed. In this embodiment, the oxide semiconductor film 144 is formed over the insulating layer 130 which is sufficiently planarized (preferably, the average surface roughness of the insulating layer 130 is less than or equal to 0.15 nm) by polishing treatment (e.g., CMP treatment).

The transistor 162 illustrated in FIG. 6A includes an oxide semiconductor in the channel formation region. Here, the oxide semiconductor film 144 included in the transistor 162 is preferably highly purified. By using a highly purified oxide semiconductor, the transistor 162 which has extremely favorable off-state current characteristics can be obtained.

Since the off-state current of the transistor 162 is small, stored data can be held for a long time by using such a transistor. In other words, power consumption can be sufficiently reduced because a semiconductor memory device in which refresh operation is unnecessary or the frequency of refresh operation is extremely low can be provided.

In this embodiment, part of a conductive film provided over the interlayer insulating film 135 is removed by chemical mechanical polishing method, so that electrode layers 142a and 142b each functioning as a source electrode layer or a drain electrode layer are formed, in the manufacturing process of the transistor 162. In this embodiment, an electrode layer 142c which is electrically connected to the gate electrode 110 is formed in the same process as the electrode layers 142a and 142b.

Further, wiring layers 138a and 138b each functioning as a source wiring layer or a drain wiring layer are provided so as to be connected to the electrode layer 142a, the electrode layer 142b, and the electrode layer 142c.

In the transistor 162, the top surface and a side surface of a gate electrode 148, which is provided over the oxide semiconductor film 144 with a gate insulating film 146 provided therebetween, are covered with an insulating film 137 including an aluminum oxide film; thus, electrical failure such as a short circuit between the gate electrode 148 and the electrode layers 142a and 142b can be prevented owing to the insulating film 137 including an aluminum oxide film even when the electrode layers 142a and 142b overlap with the top surface of the gate electrode 148. Accordingly, a transistor having less variation in characteristics and a miniaturized structure can be manufactured with high yield.

As described above, in the transistor 162, the distance between the gate electrode 148 and a region (contact region) where the oxide semiconductor film 144 is in contact with the electrode layer 142a or 142b functioning as a source electrode layer or a drain electrode layer can be short; thus, the resistance between the gate electrode 148 and the region (contact region) where the oxide semiconductor film 144 is in contact with the electrode layer 142a or 142b is reduced. As a result, on-state characteristics of the transistor 162 can be improved.

The oxide semiconductor film 144 is a film containing much (excessive) oxygen, into which oxygen is introduced in the manufacturing process. When the top surface and the side surface of the gate electrode 148 are covered with the insulating film 137 including an aluminum oxide film, a channel formation region and part of low-resistance regions in the oxide semiconductor film 144, which overlap with the gate electrode 148, can be covered with the insulating film 137 including an aluminum oxide film.

In this embodiment, an aluminum oxide film is used as the insulating film 137 including an aluminum oxide film. With the aluminum oxide film having a high density (film density higher than or equal to $3.2$ g/cm$^3$, preferably higher than or equal to $3.6$ g/cm$^3$), the transistor 162 can have stable electrical characteristics.

An insulating film 150 having a single-layer structure or a stacked-layer structure is provided over the transistor 162. In this embodiment, an aluminum oxide film is used as the insulating film 150.

In addition, a conductive layer 153 is provided in a region overlapping with the electrode layer 142a of the transistor 162 with an interlayer insulating film 135 and the insulating film 150 provided therebetween, and the electrode layer 142c, the wiring layer 138a, the interlayer insulating film 135, the insulating film 150, and the conductive layer 153 form the capacitor 164. That is, the electrode layer 142a of the transistor 162 functions as one electrode of the capacitor 164, and the conductive layer 153 functions as the other electrode of the capacitor 164. Note that the capacitor 164 may be omitted if a capacitor is not needed. Alternatively, the capacitor 164 may be separately provided above the transistor 162.

An insulating layer 152 is provided over the transistor 162 and the capacitor 164. Further, a wiring 156 for connecting the transistor 162 to another transistor is provided over the insulating layer 152. Although not illustrated in FIG. 6A, the wiring 156 is electrically connected to the wiring layer 138b and the electrode layer 142b through electrodes formed in openings provided in the insulating film 150, the insulating layer 152, and the like. Here, the electrode is preferably provided so as to overlap with at least part of the oxide semiconductor film 144 of the transistor 162.

In FIGS. 6A and 6B, the transistor 160 and the transistor 162 are provided so as to at least partly overlap with each other. The source region or the drain region of the transistor 160 is preferably provided so as to overlap with part of the oxide semiconductor film 144. Further, the transistor 162 and the capacitor 164 are provided so as to overlap with at least part of the transistor 160. For example, the conductive layer 153 of the capacitor 164 is provided so as to overlap with at least part of the gate electrode 110 of the transistor 160. With such a planar layout, the area occupied by the semiconductor device can be reduced; thus, the degree of integration can be increased.

Note that the electrical connection between the wiring layer 138b and the wiring 156 may be established by direct contact of the wiring layer 138b and the wiring 156 or through an electrode provided in the insulating film between the wiring layer 138b and the wiring 156. Alternatively, the electrical connection may be established through a plurality of electrodes.

Next, an example of a circuit configuration corresponding to FIGS. 6A and 6B is illustrated in FIG. 6C.

In FIG. 6C, a first wiring (1st line) is electrically connected to the source electrode of the transistor 160. A second wiring (2nd line) is electrically connected to the drain electrode of the transistor 160. A third wiring (3rd line) is electrically connected to one of the source electrode and the drain electrode of the transistor 162, and a fourth wiring (4th line) is electrically connected to the gate electrode of the transistor 162. The gate electrode of the transistor 160 and the other of the source electrode and the drain electrode of the transistor 162 are electrically connected to one electrode of the capacitor 164. A fifth line (5th line) is electrically connected to the other electrode of the capacitor 164.

The semiconductor device in FIG. 6C utilizes a characteristic in which the potential of the gate electrode of the transistor 160 can be held, and thus enables writing, holding, and reading of data as follows.

Writing and holding of data is described. First, the potential of the fourth line is set to a potential at which the transistor 162 is turned on, so that the transistor 162 is turned on. Accordingly, the potential of the third line is supplied to the gate electrode of the transistor 160 and the capacitor 164. That is, predetermined charge is given to the gate electrode of the transistor 160 (writing). Here, charge for supplying either of two different potential levels (hereinafter referred to as low-level charge and high-level charge) is given. After that, the potential of the fourth line is set to a potential at which the transistor 162 is turned off, so that the transistor 162 is turned off. Thus, the charge given to the gate electrode of the transistor 160 is held (holding).

Since the off-state current of the transistor 162 is extremely low, the charge of the gate electrode of the transistor 160 is held for a long time.

Next, reading of data is described. By supplying an appropriate potential (reading potential) to the fifth line while a predetermined potential (constant potential) is supplied to the first line, the potential of the second line varies depending on the amount of charge held in the gate electrode of the transistor 160. This is because in general, when the transistor 160 is an n-channel transistor, an apparent threshold voltage $V_{th\_H}$ in the case where the high-level charge is given to the gate electrode of the transistor 160 is lower than an apparent threshold voltage $V_{th\_L}$ in the case where the low-level charge is given to the gate electrode of the transistor 160. Here, an apparent threshold voltage refers to the potential of the fifth line, which is needed to turn on the transistor 160. Thus, the potential of the fifth line is set to a potential $V_0$ that is between $V_{th\_H}$ and $V_{th\_L}$, whereby charge given to the gate electrode of the transistor 160 can be determined. For example, in the case where the high-level charge is given in writing, when the potential of the fifth wiring is set to $V_0 (>V_{th\_H})$, the transistor 160 is turned on. In the case where the low-level charge is given in writing, even when the potential of the fifth wiring is set to $V_0 (<V_{th\_L})$, the transistor 160 remains in an off state. Accordingly, the data held can be read by the potential of the second line.

Note that in the case where memory cells are arrayed to be used, only data of desired memory cells needs to be read. In the case where such reading is not performed, a potential at which the transistor 160 is turned off regardless of the state of the gate electrode of the transistor 160, that is, a potential smaller than $V_{th\_H}$ may be given to the fifth wiring. Alternatively, a potential which allows the transistor 160 to be turned on regardless of a state of the gate electrode, that is, a potential higher than $V_{th\_L}$ may be given to the fifth line.

When a transistor having a channel formation region formed using an oxide semiconductor and having extremely small off-state current is applied to the semiconductor device in this embodiment, the semiconductor device can held stored data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem such as deterioration of a gate insulating film does not occur at all. In other words, the semiconductor device of one embodiment of the disclosed invention does not have a limit on the number of times of writing which is a problem in a conventional non-volatile memory, and reliability thereof is drastically improved. Furthermore, data is written depending on the on state and the off state of the transistor, whereby high-speed operation can be easily realized.

As described above, a miniaturized and highly integrated semiconductor device which has excellent electrical characteristics and a method for manufacturing the semiconductor device can be provided.

The structures, methods, and the like described in this embodiment can be combined as appropriate with any of the structures, methods, and the like described in the other embodiments.

Embodiment 4

In this embodiment, a semiconductor device which includes the transistor described in any of Embodiments 1 to 3, can hold stored data even when power is not supplied, and does not have a limitation on the number of write cycles, and which has a structure different from the structure described in Embodiment 3 will be described with reference to FIGS. 7A and 7B and FIGS. 8A and 8B.

Figure 7A:
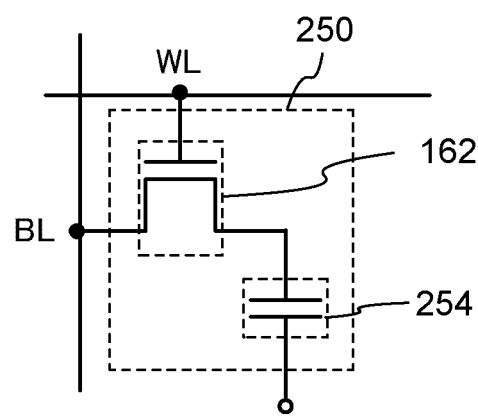
FIGS. 7A and 7B are a circuit diagram and a perspective view illustrating one embodiment of a semiconductor device.
Figure 7B:
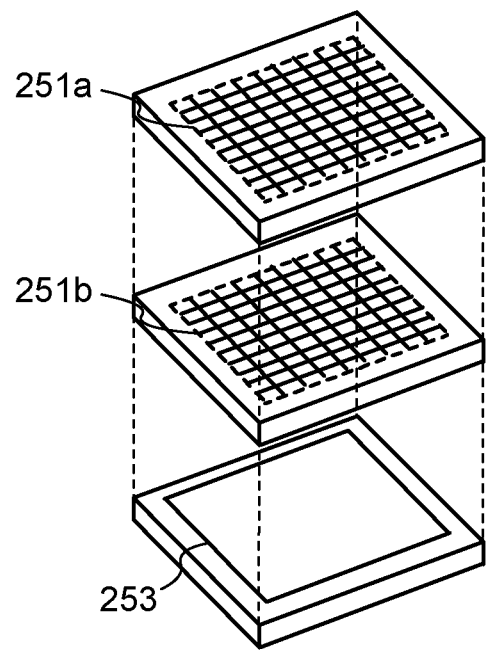

FIG. 7A illustrates an example of a circuit configuration of a semiconductor device, and FIG. 7B is a conceptual diagram illustrating an example of a semiconductor device. First, the semiconductor device illustrated in FIG. 7A will be described, and then, the semiconductor device illustrated in FIG. 7B will be described.

In the semiconductor device illustrated in FIG. 7A, a bit line BL is electrically connected to the source electrode or the drain electrode of the transistor 162, a word line WL is electrically connected to the gate electrode of the transistor 162, and the source electrode or the drain electrode of the transistor 162 is electrically connected to a first terminal of a capacitor 254.

Next, writing and holding of data in the semiconductor device (memory cell 250) illustrated in FIG. 7A will be described.

First, the potential of the word line WL is set to a potential at which the transistor 162 is turned on, so that the transistor 162 is turned on. Accordingly, the potential of the bit line BL is supplied to the first terminal of the capacitor 254 (writing). After that, the potential of the word line WL is set to a potential at which the transistor 162 is turned off, so that the transistor 162 is turned off. Thus, the potential of the first terminal of the capacitor 254 is held (holding).

Off current is extremely small in the transistor 162 formed using an oxide semiconductor. For that reason, the potential of the first terminal of the capacitor 254 (or a charge accumulated in the capacitor 254) can be held for an extremely long period by turning off the transistor 162.

Then, reading of data is described. When the transistor 162 is turned on, the bit line BL which is in a floating state and the capacitor 254 are electrically connected to each other, and the charge is redistributed between the bit line BL and the capacitor 254. As a result, the potential of the bit line BL is changed. The amount of change in potential of the bit line BL varies depending on the potential of the first terminal of the capacitor 254 (or the charge accumulated in the capacitor 254).

For example, the potential of the bit line BL obtained after charge redistribution is $(C_B*V_{B0}+C*V)/(C_B+C)$, where V is the potential of the first terminal of the capacitor 254, C is the capacitance of the capacitor 254, $C_B$ is the capacitance of the bit line BL (hereinafter also referred to as bit line capacitance), and $V_{B0}$ is the potential of the bit line BL obtained before the charge redistribution. Thus, it can be found that the potential of the bit line BL, in the case of holding the potential $V_1$, ($=(C_B*V_{B0}+C*V_1)/(C_B+C)$) is higher than the potential of the bit line BL, in the case of holding the potential $V_0$, ($=(C_B*V_{B0}+C*V_0)/(C_B+C)$) assuming that the memory cell 250 is in either of two states in which the potentials of the first terminal of the capacitor 254 are $V_1$ and $V_0$ ($V_1>V_0$).

Then, by comparing the potential of the bit line BL with a predetermined potential, data can be read.

As described above, the semiconductor device illustrated in FIG. 7A can hold charge that is accumulated in the capacitor 254 for a long time because the off-state current of the transistor 162 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 7B will be described.

The semiconductor device illustrated in FIG. 7B includes memory cell arrays 251*a* and 251*b* including a plurality of memory cells 250 illustrated in FIG. 7A as memory circuits in an upper portion, and a peripheral circuit 253 in a lower portion which is necessary for operating memory cell arrays 251 (the memory cell arrays 251*a* and 251*b*). Note that the peripheral circuit 253 is electrically connected to the memory cell array 251.

In the structure illustrated in FIG. 7B, the peripheral circuit 253 can be provided directly under the memory cell arrays 251 (the memory cell arrays 251*a* and 251*b*). Thus, the size of the semiconductor device can be decreased.

It is preferable that a semiconductor material of a transistor provided in the peripheral circuit 253 is different from that of the transistor 162. For example, silicon, germanium, silicon germanium, silicon carbide, gallium arsenide, or the like can be used, and a single crystal semiconductor is preferably used. Alternatively, an organic semiconductor material or the like may be used. A transistor formed using such a semiconductor material can operate at sufficiently high speed. Thus, a variety of circuits (e.g., a logic circuit and a driver circuit) which need to operate at high speed can be favorably achieved by using the transistor.

Note that FIG. 7B illustrates, as an example, the semiconductor device in which two memory cell arrays 251 (the memory cell arrays 251*a* and 251*b*) are stacked; however, the number of memory cells to be stacked is not limited thereto. Three or more memory cells may be stacked.

Next, a specific structure of the memory cell 250 illustrated in FIG. 7A will be described with reference to FIGS. 8A and 8B.

Figure 8A:
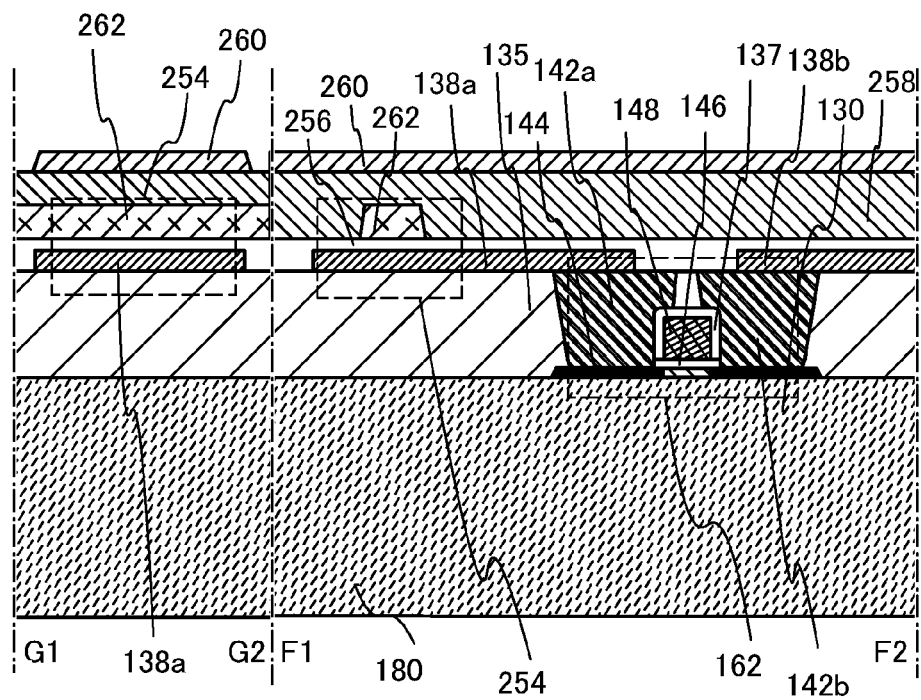
FIGS. 8A and 8B are a cross-sectional view and a plan view illustrating one embodiment of a semiconductor device.
Figure 8B:
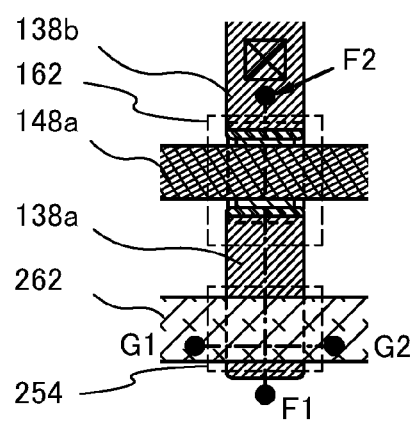

FIGS. 8A and 8B illustrate an example of the structure of the memory cell 250. FIG. 8A is a cross-sectional view of the memory cell 250. FIG. 8B is a plan of the memory cell 250. Here, FIG. 8A corresponds to cross sections taken along line F1-F2 and line G1-G2 in FIG. 8B.

The transistor 162 illustrated in FIGS. 8A and 8B can have the same structure as the transistor in any of Embodiment 1 to 3.

An insulating film 256 having a single-layer structure or a stacked-layer structure is provided over the transistor 162 over an insulating layer 180. In addition, a conductive layer 262 is provided in a region overlapping with the wiring layer 138*a* which is electrically connected to the electrode layer 142*a* of the transistor 162 with the insulating film 256 provided therebetween, and the wiring layer 138*a* which is electrically connected to the electrode layer 142*a*, the interlayer insulating film 135, the insulating film 256, and the conductive layer 262 form the capacitor 254. That is, the electrode layer 142*a* of the transistor 162 functions as one electrode of the capacitor 254, and the conductive layer 262 functions as the other electrode of the capacitor 254.

An insulating film 258 is provided over the transistor 162 and the capacitor 254. Further, a wiring 260 for connecting the memory cells 250 adjacent to each other is provided over the insulating film 258. Although not illustrated, the wiring 260 is electrically connected to the wiring layer 138*a* which is electrically connected to the electrode layer 142*a* of the transistor 162 through an opening provided in the insulating film 256, the insulating film 258, and the like. The wiring 260 may be electrically connected to the wiring layer 138*a* which is electrically connected to the electrode layer 142*a* through another conductive layer in the opening. Note that the wiring 260 corresponds to the bit line BL in the circuit diagram of FIG. 7A.

In FIGS. 8A and 8B, the electrode layer 142*b* of the transistor 162 can also function as a source electrode of a transistor included in an adjacent memory cell.

When the planar layout in FIG. 8A is employed, the area occupied by the semiconductor device can be reduced; thus, the degree of integration can be increased.

As described above, the plurality of memory cells formed in multiple layers in the upper portion is each formed with a transistor including an oxide semiconductor. Since the transistor including an oxide semiconductor has low off-state current, stored data can be held for a long time by using the transistor. In other words, power consumption can be adequately reduced because the frequency of refresh operation can be extremely low.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, the use of a structure where the peripheral circuit and the memory circuit are stacked leads to an increase in the degree of integration of the semiconductor device.

As described above, a miniaturized and highly integrated semiconductor device which has excellent electrical characteristics and a method for manufacturing the semiconductor device can be provided.

This embodiment can be implemented in appropriate combination with any of the structures described in the other embodiments.

Embodiment 5

In this embodiment, examples of application of the semiconductor device described in any of the above embodiments to portable devices such as mobile phones, smartphones, and e-book readers will be described with reference to FIGS. 9A and 9B, FIG. 10, FIG. 11, and FIG. 12.

In portable electronic devices such as mobile phones, smartphones, and e-book readers, an SRAM or a DRAM is used to store image data temporarily. This is because response speed of a flash memory is low and thus a flash memory is not suitable for image processing. On the other hand, an SRAM or a DRAM has the following characteristics when used for temporary storage of image data.

Figure 9A:
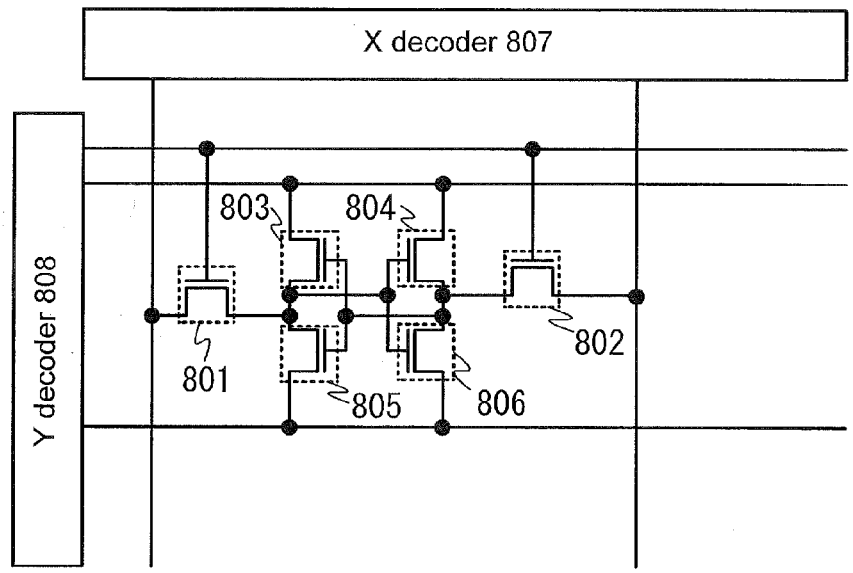
FIGS. 9A and 9B are circuit diagrams each illustrating one embodiment of a semiconductor device.

In a normal SRAM, as illustrated in FIG. 9A, one memory cell includes six transistors, which are a transistor 801, a transistor 802, a transistor 803, a transistor 804, a transistor 805, and a transistor 806, and they are driven by an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 9B:
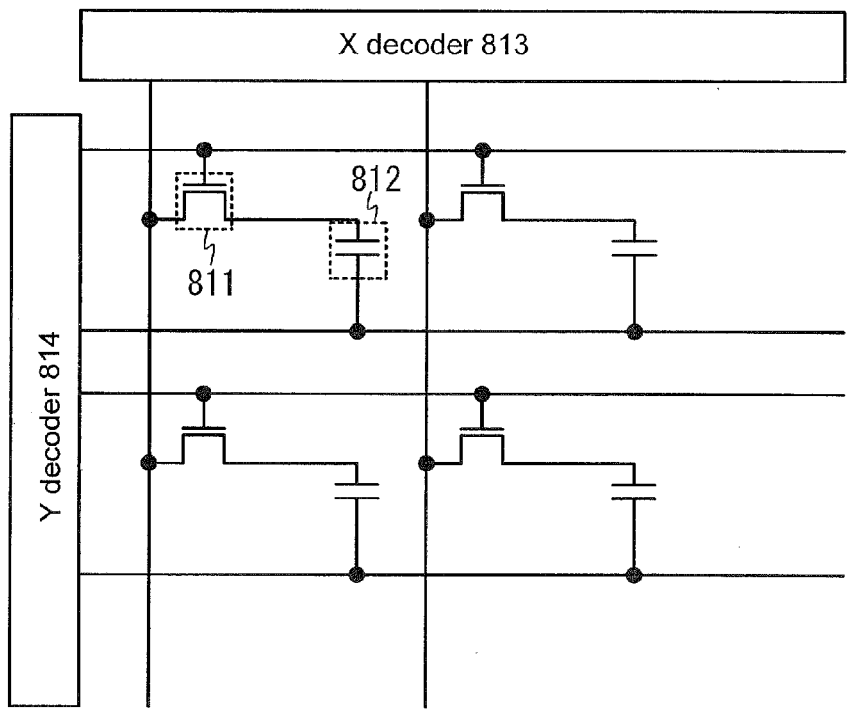

On the other hand, as illustrated in FIG. 9B, a memory cell in a DRAM includes a transistor 811 and a storage capacitor 812, and is driven by an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described the above embodiments is about 10 $F^2$ and frequent refreshing is not needed. Thus, the area of the memory cell is reduced, and the power consumption can be reduced.

Figure 10:
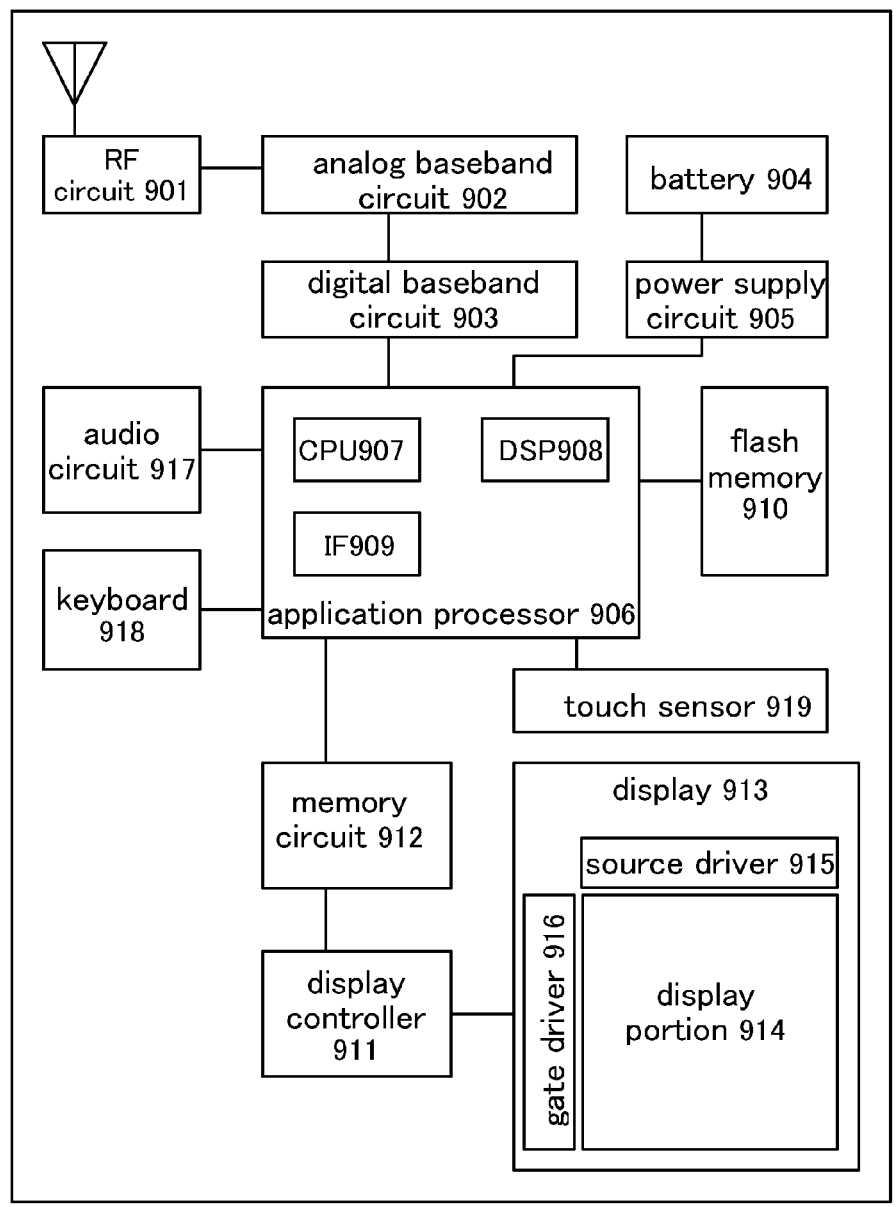
FIG. 10 is a block diagram illustrating one embodiment of a semiconductor device.

Next, a block diagram of a portable device is illustrated in FIG. 10. A portable device illustrated in FIG. 10 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 11:
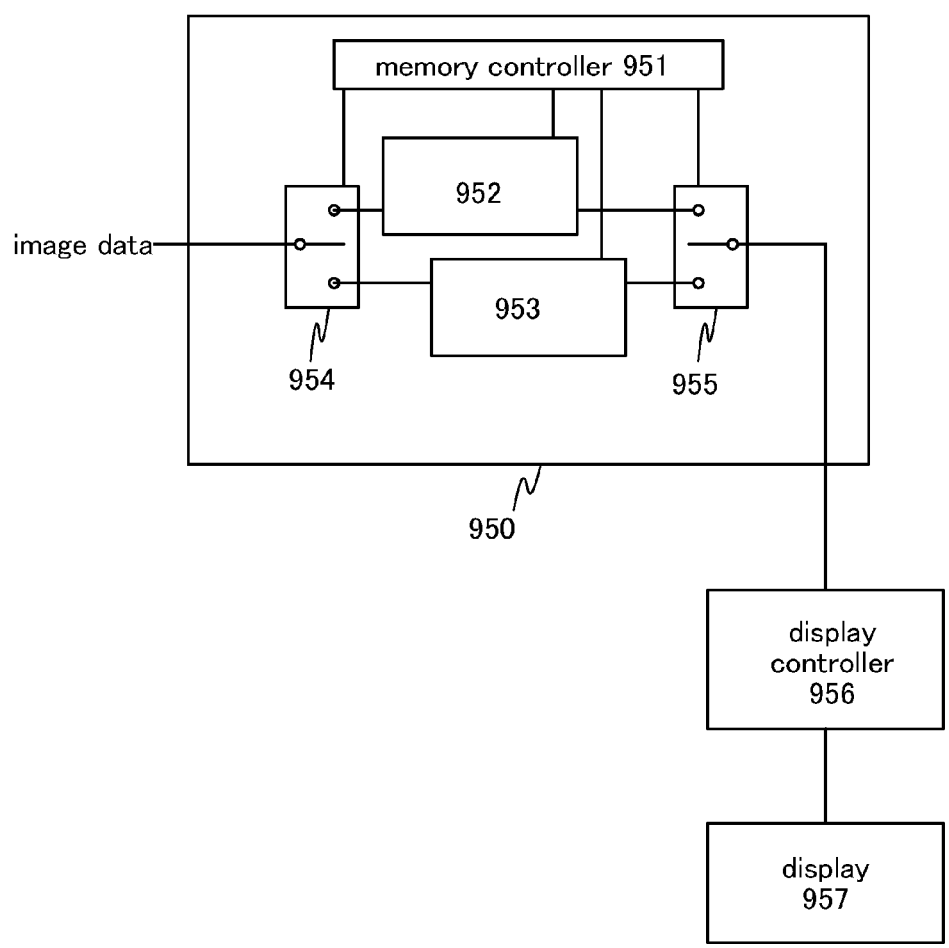
FIG. 11 is a block diagram illustrating one embodiment of a semiconductor device.

Next, FIG. 11 shows an example in which the semiconductor device described in any of the above embodiments is used for a memory circuit 950 in a display. The memory circuit 950 illustrated in FIG. 11 includes a memory 952, a memory 953, a switch 954, a switch 955, and a memory controller 951. Further, the memory circuit is connected to a display controller 956 which reads and controls image data input through a signal line (input image data) and data stored in the memories 952 and 953 (stored image data), and is also connected to a display 957 which displays an image based on a signal input from the display controller 956.

First, image data (input image data A) is formed by an application processor (not shown). The input image data A is stored in the memory 952 though the switch 954. The image data (stored image data A) held in the memory 952 is transmitted and displayed to the display 957 through the switch 955 and the display controller 956.

In the case where the input image data A is not changed, the stored image data A is read from the memory 952 through the switch 955 by the display controller 956 with a frequency of 30 Hz to 60 Hz in general.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

By alternately writing and reading image data to and from the memory 952 and the memory 953 as described above, images are displayed on the display 957. Note that the memory 952 and the memory 953 are not limited to separate memories, and a single memory may be divided and used. By employing the semiconductor device described in any of the above embodiments for the memory 952 and the memory 953, data can be written and read at high speed and held for a long time, and power consumption can be sufficiently reduced.

Figure 12:
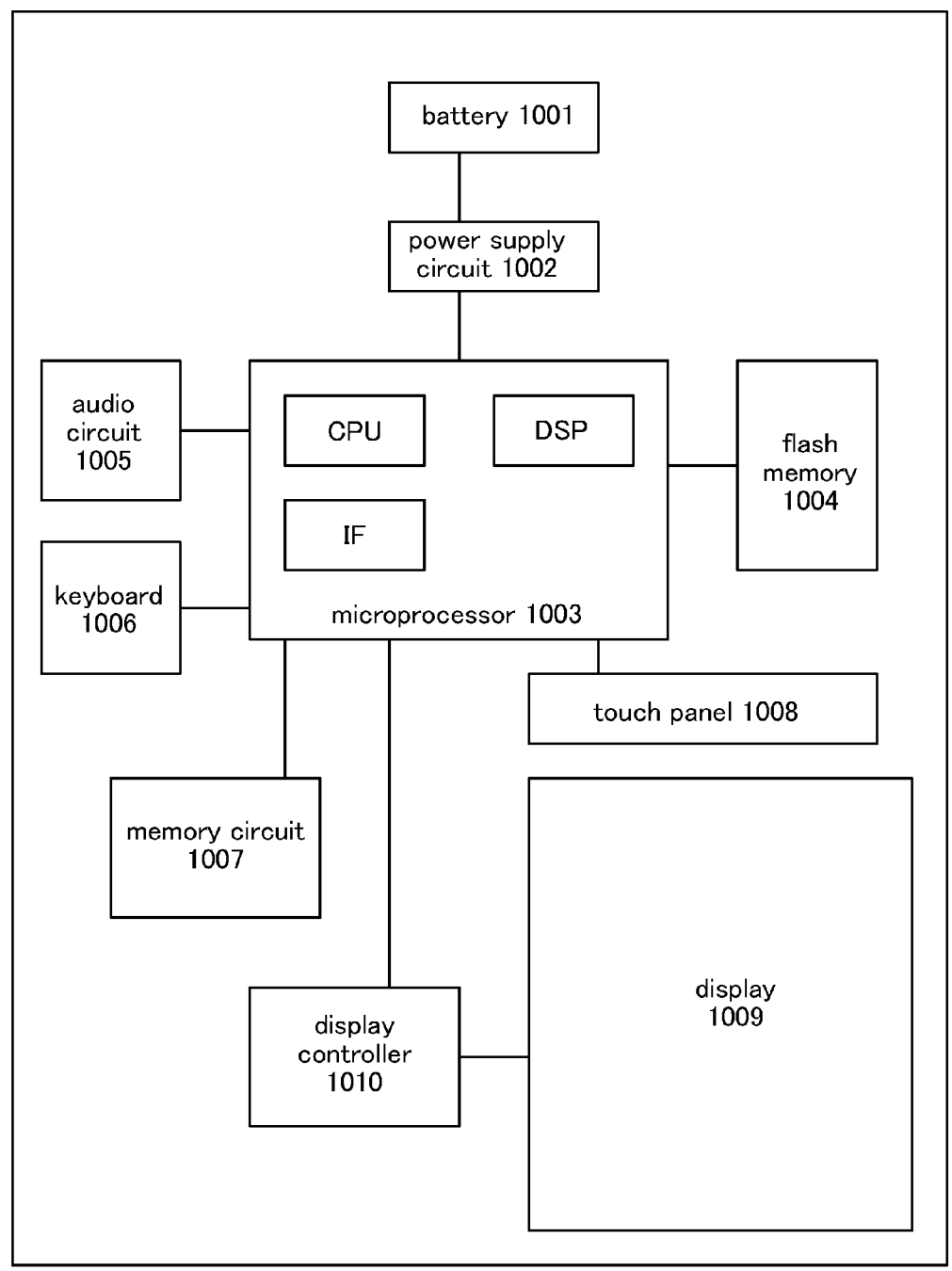
FIG. 12 is a block diagram illustrating one embodiment of a semiconductor device.

Next, FIG. 12 is a block diagram of an e-book reader. FIG. 12 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 12. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, there is a function of storing and holding information of a place specified by users. In order to save information for a long time, the information may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Thus, a portable device in which writing and reading of data are performed at high speed, data is held for a long time, and power consumption is sufficiently reduced, can be obtained.

The structures, methods, and the like described in this embodiment can be combined as appropriate with any of the structures, methods, and the like described in the other embodiments.

This application is based on Japanese Patent Application serial no. 2011-226080 filed with Japan Patent Office on Oct. 13, 2011, the entire contents of which are hereby incorporated by reference.

What is claimed is:

1. A semiconductor device comprising:
   an oxide semiconductor film over an oxide insulating film;
   a gate insulating film over the oxide semiconductor film;
   a gate electrode layer over the gate insulating film overlapping with the oxide semiconductor film;
   an insulating film including an aluminum oxide film covering an entire top surface and an entire side surface of the gate electrode layer;
   an interlayer insulating layer over the oxide semiconductor film, the gate insulating film, the gate electrode layer, and the insulating film including the aluminum oxide film, wherein an opening reaching the oxide semiconductor film is provided in the interlayer insulating layer; and
   a wiring layer in contact with the oxide semiconductor film and a top surface and a side surface of the insulating film including the aluminum oxide film, the wiring layer being provided in the opening,
   wherein the interlayer insulating layer is in contact with a top surface and a side surface of the oxide semiconductor film and the top surface of the insulating film including the aluminum oxide film, and
   wherein the insulating film including the aluminum oxide film is in contact with the top surface of the oxide semiconductor film.

2. The semiconductor device according to claim 1,
   wherein the oxide semiconductor film comprises a channel formation region and low-resistance regions between which the channel formation region is sandwiched, and
   wherein each of the low-resistance regions includes a dopant.

3. The semiconductor device according to claim 1, wherein an oxygen concentration in a region overlapping with the gate electrode layer and the insulating film including the aluminum oxide film in the oxide semiconductor film is higher than an oxygen concentration in a region other than the region overlapping with the gate electrode layer and the insulating film including the aluminum oxide film in the oxide semiconductor film.

4. The semiconductor device according to claim 1, further comprising an electrode layer below the oxide semiconductor film,
   wherein the electrode layer is in contact with the oxide semiconductor film and overlaps with the wiring layer.

5. The semiconductor device according to claim 1, further comprising an electrode layer below the oxide semiconductor film,
   wherein the electrode layer is in contact with the oxide semiconductor film and overlaps with the wiring layer, and
   wherein the electrode layer is provided over the oxide insulating film.

6. The semiconductor device according to claim 1, further comprising an electrode layer below the oxide semiconductor film,
   wherein the electrode layer is in contact with the oxide semiconductor film and overlaps with the wiring layer, and
   wherein the electrode layer is embedded in the oxide insulating film.

* * * * *